(12) United States Patent
Morita et al.

(10) Patent No.: US 7,074,698 B2
(45) Date of Patent: Jul. 11, 2006

(54) METHOD OF FABRICATING SEMICONDUCTOR DEVICE USING PLASMA-ENHANCED CVD

(75) Inventors: Noboru Morita, Kanagawa (JP); Tatsuya Usami, Kanagawa (JP); Koichi Ohto, Kanagawa (JP); Sadayuki Ohnishi, Kanagawa (JP); Koji Arita, Kanagawa (JP); Ryohei Kitao, Kanagawa (JP); Yoichi Sasaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 197 days.

(21) Appl. No.: 10/766,921

(22) Filed: Jan. 30, 2004

(65) Prior Publication Data

US 2004/0185668 A1    Sep. 23, 2004

(30) Foreign Application Priority Data

Jan. 31, 2003   (JP) ............................. 2003-024719

(51) Int. Cl.
*H01L 21/26* (2006.01)
*H01L 21/42* (2006.01)
(52) U.S. Cl. .................. 438/513; 438/475; 438/509
(58) Field of Classification Search ................ 438/513, 438/510, 514, 474, 475, 680, 681, 679, 692, 438/700, 706, 740, 770, 773, 775, 509
See application file for complete search history.

(56) References Cited

U.S. PATENT DOCUMENTS 6,559,039 B1 *   5/2003   Wang et al. ................. 438/542
6,713,127 B1 *   3/2004   Subramony et al. ... 427/255.37

OTHER PUBLICATIONS

Noguchi, et al., "TDDB Improvement in CU Metallization Under Bias Stress", 2000 IEEE, 38th Annual International Reliability Physics Symposium, pp. 339-434.
Junji Noguchi, et al., "TDDB Improvement in Cu Metallization under Bias Stress", 30th Annual International Reliability Physics Symposium, San Jose, CA, IEEE 2000, pp. 339-343.

* cited by examiner

*Primary Examiner*—David Nhu
(74) *Attorney, Agent, or Firm*—McGinn IP Law Group, PLLC

(57) ABSTRACT

A method of fabricating a semiconductor device using a PECVD method is provided, which improves the adhesion strength of a deposited dielectric layer to an underlying layer and the reliability of the deposited dielectric layer. After placing a substrate in a chamber, a gas having a thermal conductivity of 0.1 W/mK or greater (e.g., $H_2$ or He) is introduced into the chamber, thereby contacting the gas with the substrate for stabilization of a temperature of the substrate. A desired dielectric layer is deposited on or over the substrate in the chamber using a PECVD method after the step of introducing the gas. As the desired dielectric layer, a dielectric layer having a low dielectric constant, such as a SiCH, SiCHN, or SiOCH layer, is preferably used.

27 Claims, 18 Drawing Sheets

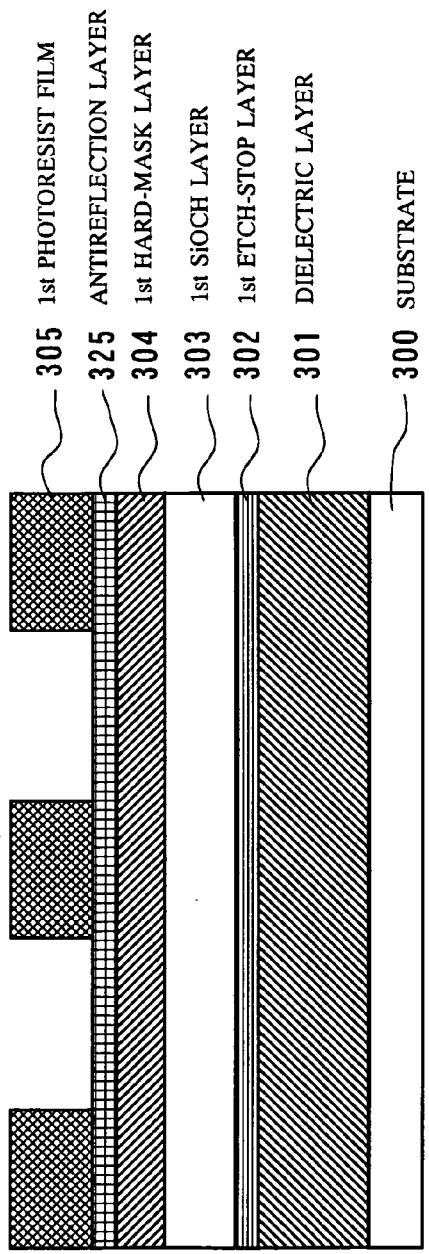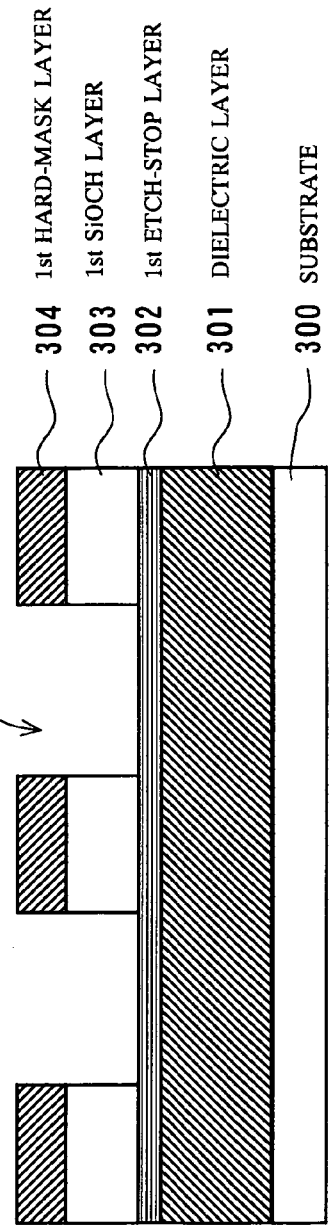
FIG. 3A
FIG. 3B

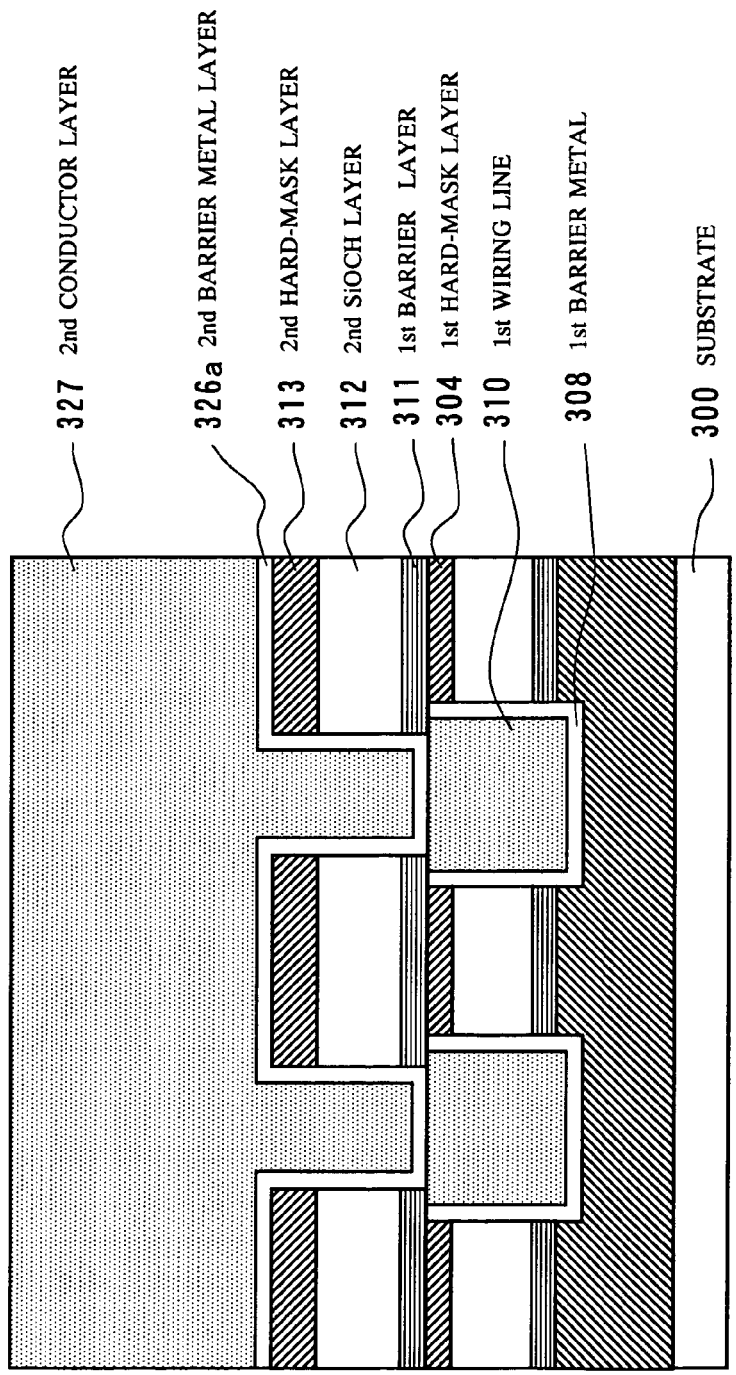

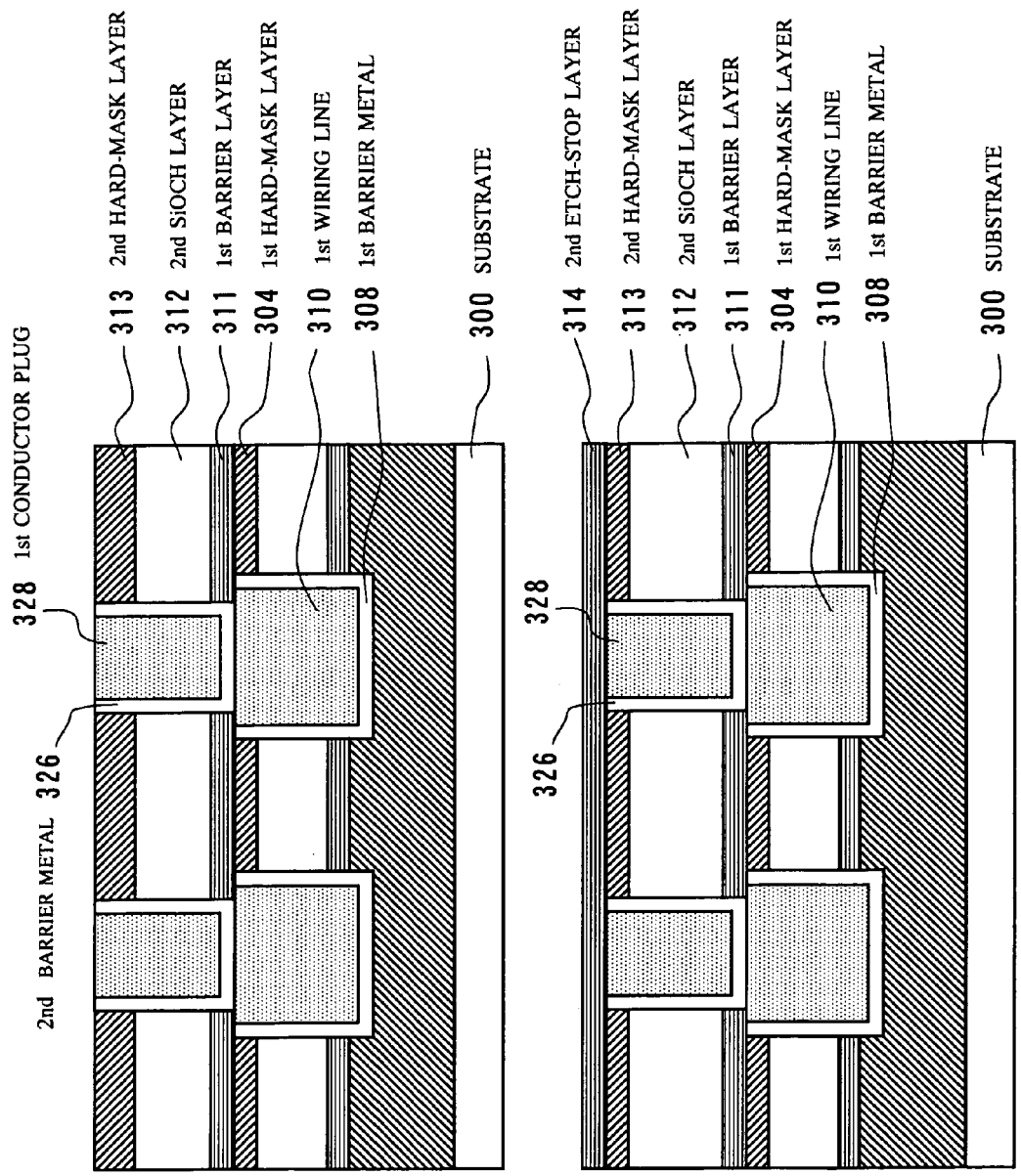

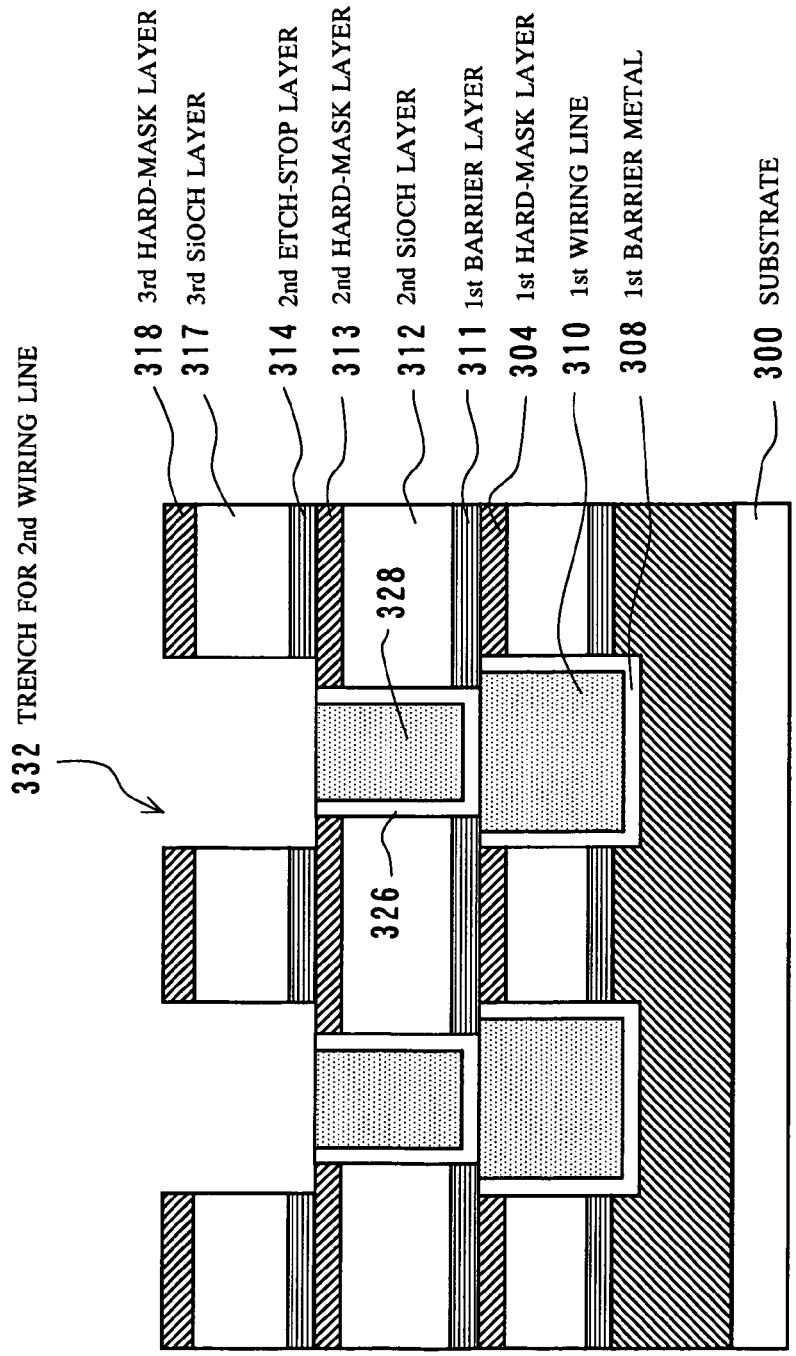

METHOD OF FABRICATING SEMICONDUCTOR DEVICE USING PLASMA-ENHANCED CVD

BACKGROUND OF THE INVENTION

1. Field of the Invention

The present invention relates to a method of fabricating a semiconductor device using Plasma-Enhanced Chemical Vapor Deposition (PECVD) method, which includes a step of stabilizing the substrate temperature prior to a step of depositing a dielectric layer. The invention is preferably applied to fabrication of a semiconductor device having a wiring structure or structures formed by using a low dielectric-constant interlayer dielectric layer or layers.

2. Description of the Related Art

In recent years, to solve the problem of RC delay increase in wiring or interconnection lines caused by the constantly progressing miniaturization of semiconductor devices, the use of low dielectric-constant (low k) dielectric materials has been discussed for reducing the line capacitance. For example, the use of a SiOCH layer as the interlayer dielectric layer and the use of a SiCH or SiCHN layer as the dielectric barrier layer or the etch-stop layer have been discussed and researched. These low dielectric-constant dielectric materials are typically deposited by a PECVD method. where the deposition temperature is typically set in the range from 300° C. to 500° C. This is to provide the initial thermal energy required to overcome the reaction barrier. Therefore, a step of stabilizing the substrate temperature at a desired level is required prior to the deposition step of a desired dielectric layer.

FIG. 1 shows a prior-art deposition process sequence for the above-described low dielectric-constant materials using a known PECVD method.

As seen from FIG. 1, in the step S1, a semiconductor substrate or wafer is carried in the reaction chamber of a known PECVD apparatus. In the step S2, a gas is fed into the chamber to stabilize the substrate temperature. i.e., the temperature of the substrate thus carried-in. The gas is used to transmit the heat generated by the heater of the apparatus to the whole substrate, making the temperature substantially steady over the entire substrate.

In the step S3, the chamber is evacuated to remove the gas for stabilizing the substrate temperature from the chamber. In the step S4, a gaseous material or materials (i.e., a deposition gas or gases) for a desired low dielectric-constant dielectric layer is/are fed into the chamber. In the step S5, the desired low dielectric-constant dielectric layer is deposited by a PECVD method on or over the surface of the substrate or wafer using plasma generated in the chamber. In the step S6, the chamber is evacuated to remove the remaining gaseous material(s) (i.e., the remaining deposition gas(es)) and reaction products existing in the chamber. In the step S7, the substrate on which the desired low dielectric-constant dielectric layer has been deposited is carried out from the chamber.

In the prior-art deposition method for the above-described low dielectric-constant materials shown in FIG. 1. nitrogen gas ($N_2$) is usually used as the gas for stabilizing the substrate temperature in the step S2. This is because $N_2$ is low in cost and easy to handle. In this case, however, a problem of the adhesion strength degradation of the deposited low dielectric-constant dielectric layer with respect to an underlying dielectric layer and an underlying copper (Cu) wiring line is likely to occur. According to the inventors' research, it was found that this problem is caused by the following reason.

As shown in Table 1 below, $N_2$ is relatively lower in thermal conductivity among these gases and therefore, the rise of the substrate temperature in the step S2 is relatively slow. Thus, the, subsequent deposition step S5 of the dielectric layer using a PECVD method starts before the substrate temperature rises to a sufficiently high degree. As a result, the quality of the deposited dielectric layer will be low or bad in the initial stage of the deposition step S5, thereby causing the adhesion strength degradation of the deposited dielectric layer to an underlying dielectric layer and an underlying Cu line.

TABLE 1

| GAS | THERMAL CONDUCTIVITY (W/mK) |
|---|---|
| $H_2$ | 0.1869 |
| He | 0.1567 |
| $N_2$ | 0.0260 |
| Ar | 0.0179 |
| Xe | 0.0055 |

In addition it was reported by Proceeding of IRPS 2000, pp. 339–343 that the Time-Dependent Dielectric Breakdown (TDDB) lifetime between Cu wiring lines (i.e., the inter-wire TDDB lifetime for Cu lines) deteriorates when plasma process using $N_2$ gas is applied to Cu wiring lines prior to the deposition of a silicon nitride (SiN) layer thereon. Thus, there is an anxiety that $N_2$ gas used in the step S2 of stabilizing the substrate temperature is left In the subsequent deposition step S5, thereby inducing the inter-wire TDDB lifetime deterioration. If so, the reliability of the deposited dielectric layer (and therefore, the semiconductor device) will decline.

SUMMARY OF THE INVENTION

Accordingly, an object of the present invention is to provide a method of fabricating a semiconductor device that prevents the quality of a deposited dielectric layer from deteriorating in the initial stage of a deposition step thereof using a PECVD method, thereby improving the adhesion strength of the deposited dielectric layer to an underlying material.

Another object of the present invention is to provide a method of fabricating a semiconductor device that improves the reliability of a dielectric layer deposited using a PECVD method.

The above objects together with others not specifically mentioned will become clear to those skilled in the art from the following description.

A method of fabricating a semiconductor device according to a first aspect of the present invention comprises the steps of:

placing a substrate in a chamber;
  introducing a gas having a thermal conductivity of 0.1 W/mK or greater into the chamber, thereby contacting the gas with the substrate for stabilization of a temperature of the substrate; and
  depositing a desired dielectric layer on or over the substrate in the chamber using a PECVD method after the step of introducing the gas.

With the method of fabricating a semiconductor device according to the first aspect of the invention, a gas having a thermal conductivity of 0.1 W/mK or greater is introduced into the chamber, thereby contacting the gas with the substrate for stabilization of a temperature of the substrate. Thereafter, a desired dielectric layer is deposited on or over the substrate in the chamber using a PECVD method. Thus, compared with the above-described prior-art method using $N_2$ gas having a thermal conductivity of 0.0260 W/mK for stabilizing the substrate temperature, the rise of the substrate temperature is faster.

Therefore, without lengthening the period of contacting the gas with the substrate, the step of depositing the desired dielectric layer may start after the substrate temperature rises to a desired level. As a result, the quality of the deposited dielectric layer is prevented from deteriorating in the initial stage of the deposition step thereof using a PECVD method. This improves the adhesion strength of the deposited dielectric layer to an underlying material on or over the substrate.

Moreover, since $N_2$ gas is not used to stabilize the substrate temperature, there is no anxiety that the inter-wire TDDB lifetime deterioration occurs due to the remaining $N_2$ gas. Thus, the reliability of the deposited dielectric layer is improved.

If the gas has a thermal conductivity less than 0.1 W/mK, obtainable advantages are insufficient. Thus, the gas needs to have a thermal conductivity of 0.1 W/mK or greater in the method according to the first aspect of the invention.

As the gas having a thermal conductivity of 0.1 W/mK or greater, preferably, hydrogen ($H_2$) or helium (He) gas is used. This is because $H_2$ and He gasses are easily applicable to the improvement of the rising rate of the substrate temperature. He gas is more preferred, because the step of evacuating the chamber performed after the step of depositing the dielectric layer may be eliminated.

As the desired dielectric layer, a dielectric layer having a low dielectric constant, such as a SiCH, SiCHN, or SiOCH layer, is preferably used. This is because the advantages of the invention are more beneficial.

When a SiCH layer is used as the desired dielectric layer, it Is preferred that the SiCH layer is deposited on or over the substrate using an organic silane and an inert gas.

When a SiCHN layer is used as the desired dielectric layer, it is preferred that the SiCHN layer is deposited on or over the substrate using an organic silane, an inert gas, and a nitrogen-containing gas.

When a SiOCH layer is used as the desired dielectric layer, it is preferred that the SiOCH layer is deposited on or over the substrate using an organic silane, an inert gas, and an oxidizing gas.

Preferably, as the above-described organic silane, at least one of trimethylsilane [$(CH_3)_3Si$], tetramethylsilane [$(CH_3)_4Si$], and trimethylvinylsilane [$(CH_3)_3SiCH=CH_2$] is used.

As the above-described inert gas, at least one of helium (He), argon (Ar), and xenon (Xe) is preferably used.

As the above-described nitrogen-containing gas, ammonia ($NH_3$) is preferably used.

As the above-described oxidizing gas, at least one of oxygen ($O_2$), ozone ($O_3$), carbon monoxide (CO), carbon dioxide ($CO_2$), and water ($H_2O$) is preferably used.

A method of fabricating a semiconductor device according to a second aspect of the present invention comprises the steps of:

placing a substrate in a chamber;

introducing hydrogen ($H_2$) or helium (He) gas into the chamber, thereby contacting the gas with the substrate for stabilization of a temperature of the substrate;

introducing an organic silane and an inert gas into the chamber after evacuating the hydrogen ($H_2$) or helium (He) gas; and depositing a SiCH layer on or over the substrate using the organic silane and the inert gas while plasma is present in the chamber.

With the method of fabricating a semiconductor device according to the second aspect of the invention, hydrogen ($H_2$) or helium (He) gas having a thermal conductivity greater than 0.1 W/mK is introduced into the chamber, thereby contacting the gas with the substrate for stabilization of a temperature of the substrate. Thereafter, an organic silane and an inert gas are introduced into the chamber after evacuating the hydrogen ($H_2$) or helium (He) gas. Using the organic silane and the inert gas thus introduced, a SiCH layer is deposited on or over the substrate while plasma is present in the chamber. Thus, compared with the above-described prior-art method using $N_2$ gas having a thermal conductivity of 0.0260 W/mK for stabilizing the substrate temperature, the rise of the substrate temperature Is faster.

Therefore, without lengthening the period of contacting the hydrogen ($H_2$) or helium (He) gas with the substrate, the step of depositing the SiCH layer may start after the substrate temperature rises to a desired level. As a result, the quality of the SiCH layer is prevented from deteriorating in the initial stage of the deposition step thereof using a PECVD method. This improves the adhesion strength of the deposited SiCH layer to an underlying layer or the substrate.

Moreover, since $N_2$ gas is not used to stabilize the substrate temperature, there is no anxiety that the inter-wire TDDB lifetime deterioration of the SiCH layer occurs due to the remaining $N_2$ gas Thus, the reliability of the deposited SiCH layer is improved.

In the method according to the second aspect of the invention, it is preferred that the SiCH layer is deposited on a copper wiring line.

A method of fabricating a semiconductor device according to a third aspect of the present invention comprises the steps of:

placing a substrate in a chamber;

introducing hydrogen ($H_2$) or helium (He) gas into the chamber, thereby contacting the gas with the substrate for stabilization of a temperature of the substrate;

introducing an organic silane, an inert gas, and a nitrogen-containing gas into the chamber after evacuating the hydrogen ($H_2$) or helium (He) gas; and depositing a SiCHN layer on or over the substrate using the organic silane, the inert gas, and the nitrogen-containing gas while plasma is present in the chamber.

With the method of fabricating a semiconductor device according to the third aspect of the invention, hydrogen ($H_2$) or helium (He) gas having a thermal conductivity greater than 0.1 W/mK is introduced into the chamber, thereby contacting the gas with the substrate for stabilization of a temperature of the substrate. Thereafter, an organic silane, an inert gas, and a nitrogen-containing gas are introduced into the chamber after evacuating the hydrogen ($H_2$) or helium (He) gas. Using the organic silane, the inert gas, and the nitrogen-containing gas thus introduced, a SiCHN layer is deposited on or over the substrate while plasma is present in the chamber. Thus, compared with the above-described prior-art method using $N_2$ gas having a thermal conductivity of 0.0260 W/mK for stabilizing the substrate temperature, the rise of the substrate temperature is faster.

Therefore, without lengthening the period of contacting the hydrogen ($H_2$) or helium (He) gas with the substrate, the step of depositing the SiCHN layer may start after the substrate temperature rises to a desired level. As a result, the quality of the SiCHN layer is prevented from deteriorating in the initial stage of the deposition step thereof using a PECVD method. This improves the adhesion strength of the deposited SiCHN layer to an underlying layer or the substrate.

Moreover, since $N_2$ gas is not used to stabilize the substrate temperature, there is no anxiety that the inter-wire TDDB life deterioration occurs due to the remaining $N_2$ gas. Thus, the reliability of the deposited SiCHN layer is improved.

In the method according to the third aspect of the invention, it is preferred that the SiCHN layer is deposited on a copper wiring line.

A method of fabricating a semiconductor device according to a fourth aspect of the present invention comprises the steps of:

placing a substrate in a chamber;

introducing hydrogen ($H_2$) or helium (He) gas into the chamber, thereby contacting the gas with the substrate for stabilization of a temperature of the substrate;

is introducing an organic silane, an inert gas, and an oxidizing gas into the chamber after evacuating the hydrogen ($H_2$) or helium (He) gas: and depositing a SiOCH layer on or over the substrate using the organic silane, the inert gas, and the oxidizing gas while plasma is present in the chamber.

With the method of fabricating a semiconductor device according to the fourth aspect of the invention, hydrogen ($H_2$) or helium (He) gas having a thermal conductivity greater than 0.1 W/mK is introduced into the chamber, thereby contacting the said gas with the substrate for stabilization of a temperature of the substrate. Thereafter, an organic silane, an inert gas, and an oxidizing gas are introduced into the chamber after evacuating the hydrogen ($H_2$) or helium (He) gas. Using the organic silane, the inert gas, and the oxidizing gas thus introduced, a SiOCH layer is deposited on or over the substrate while plasma is present in the chamber. Thus, compared with the above-described prior-art method using $N_2$ gas having a thermal conductivity of 0.0260 W/mK for stabilizing the substrate temperature, the rise of the substrate temperature is faster.

Therefore, without lengthening the period of contacting the hydrogen ($H_2$) or helium (He) gas with the substrate, the step of depositing the SiOCH layer may start after the substrate temperature rises to a desired level. As a result, the quality of the SiOCH layer is prevented from deteriorating in the initial stage of the deposition step thereof using a PECVD method. This improves the adhesion strength of the deposited SiOCH layer to an underlying layer or the substrate.

Moreover, since $N_2$ gas is not used to stabilize the substrate temperature, there is no anxiety that the inter-wire TDDB life deterioration of the SiOCH layer occurs due to the remaining $N_2$ gas. Thus, the reliability of the deposited SiOCH layer is improved.

In the method according to the fourth aspect of the invention, it is preferred that the SiOCH layer is deposited on a SiCHN layer.

The "substrate" used in the methods according to the first to fourth aspects of the invention is typically a semiconductor substrate. However, any other substrate such as a dielectric substrate may be used for the invention.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
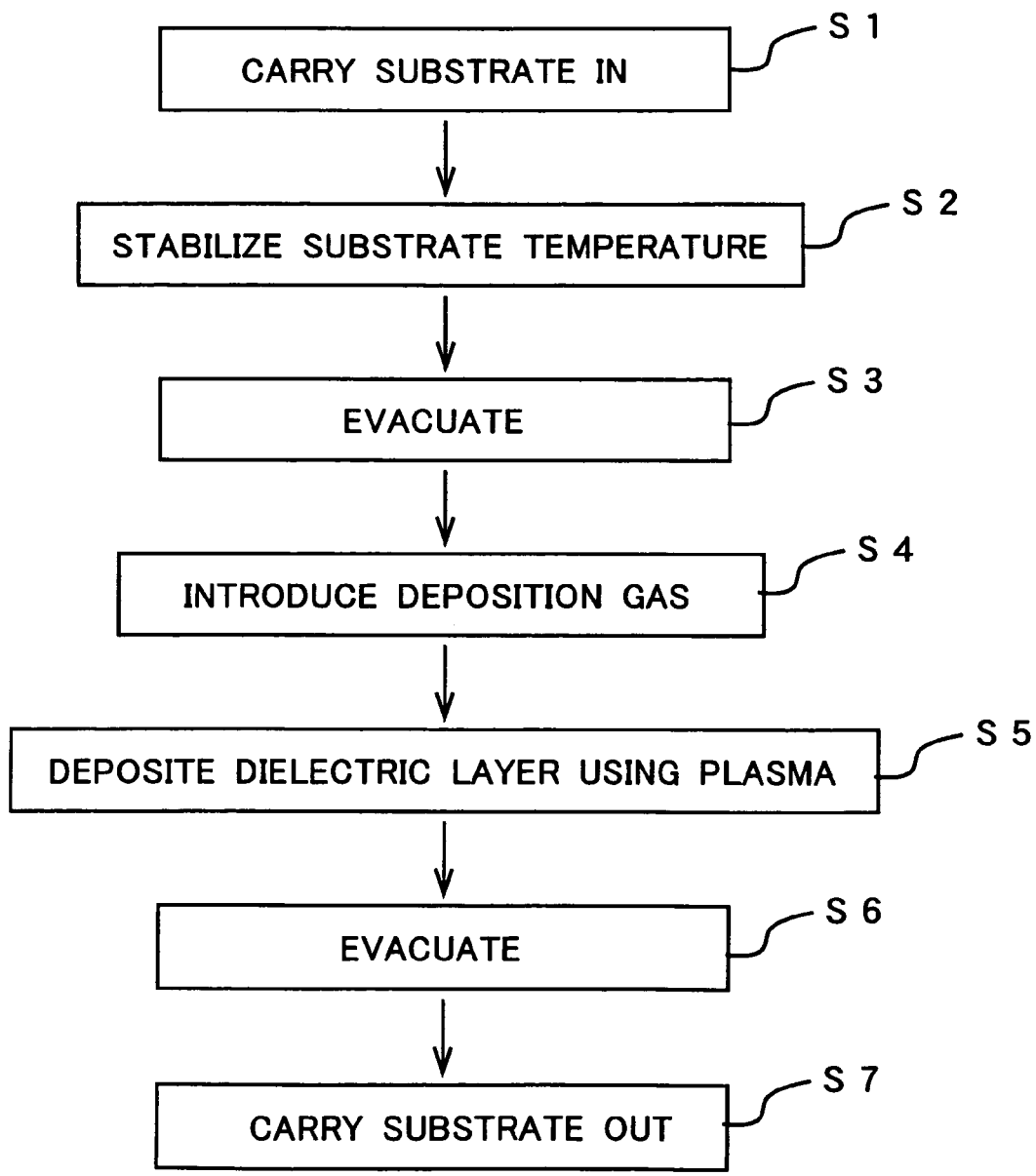
FIG. 1 Is a flowchart showing the process steps of a prior-art method of fabricating a semiconductor device, in which a dielectric layer is deposited using a PECVD method.

Preferred embodiments of the present invention will be described in detail below while referring to the drawings attached.

(Configuration of Semiconductor Device)

Figure 2:
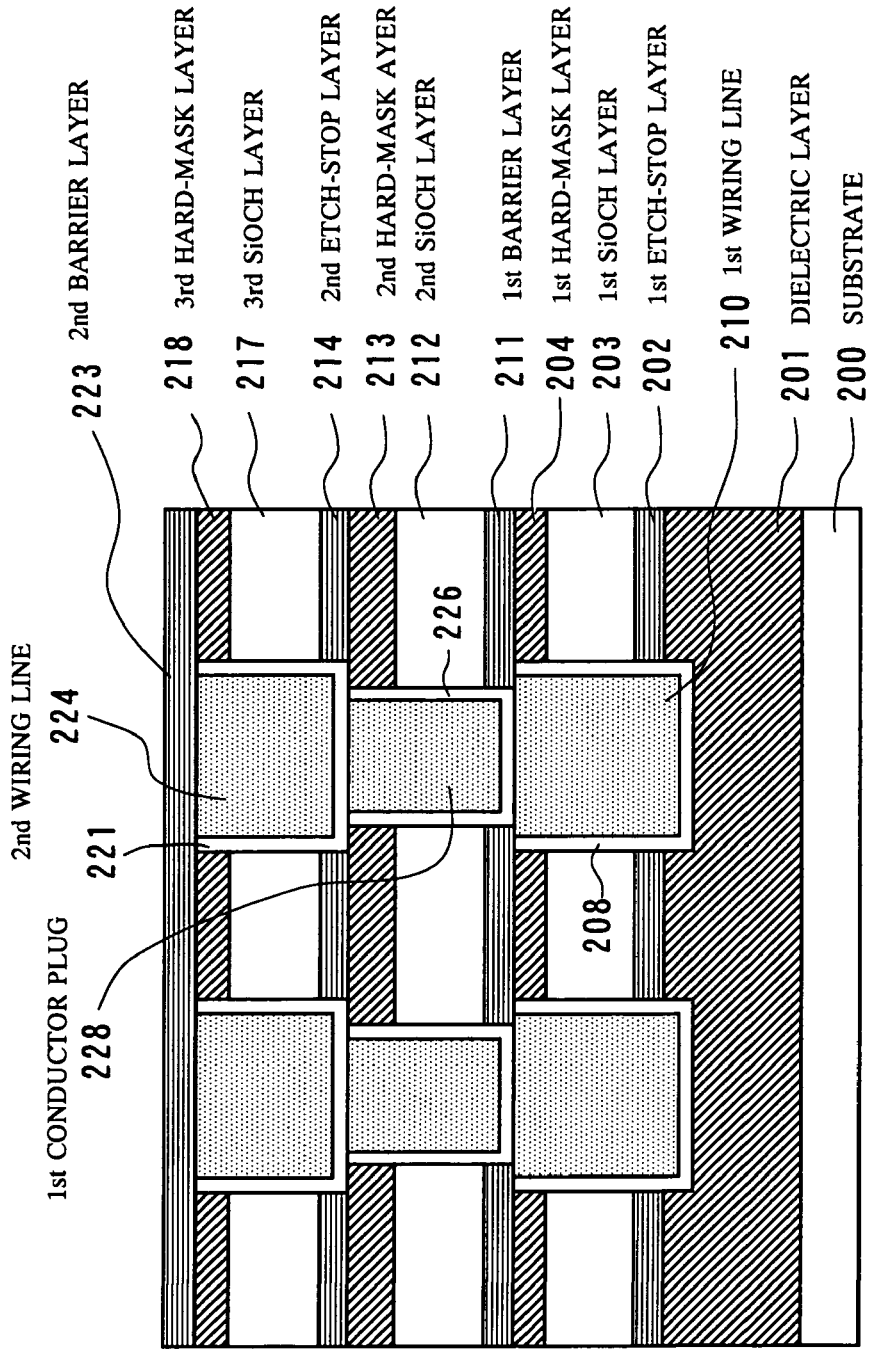
FIG. 2 is a partial cross-sectional view showing the configuration of a semiconductor device fabricated by a method according to an embodiment of the present invention.

A semiconductor device shown in FIG. 2 is fabricated by a method according to an embodiment of the present invention. This device has a single damascene structure.

The device of FIG. 2 comprises a dielectric layer 201 formed on a single-crystal silicon (Si) substrate 200. The substrate 200 includes necessary circuit elements such as Metal-Oxide-Semiconductor Field-Effect Transistors (MOSFETs) formed in its surface area. The dielectric layer 201 covers the whole surface of the substrate and serves as an interlayer dielectric layer.

On the dielectric layer 201, a first dielectric etch-stop layer 202, a first SiOCH layer 203, and a first dielectric hard-mask layer 204 are stacked in this order.

A first wiring, which includes first wiring lines (or wires) 210 and corresponding barrier metals 208, is formed in such a way as to be buried in these stacked dielectric layers 202, 203, and 204. Thus, the first wiring has a burled wiring structure. The wiring lines 210 are made of copper or copper-based alloy. Each barrier metal 208 covers and contacts the bottom and side surfaces of a corresponding one of the wiring lines 210. The bottom of the first wiring is lower than the underlying dielectric layer 201 and thus, it is located in the layer 201.

The barrier metal 208 is provided to prevent the Cu atoms of the first wiring line 210 from diffusing into the neighboring materials.

A first dielectric barrier layer 211 is formed to cover the top of the first wiring and the exposed areas of the first hard-mask layer 204. On the first barrier layer 211, a second dielectric SiOCH layer 212 and a second dielectric hard-mask layer 213 are stacked in this order. The combination of the layers 212 and 213 serves as an interlayer dielectric layer First conductor plugs 228 are formed to vertically penetrate the first barrier layer 211, the second SiOCH layer 212, and the second dielectric hard-mask layer 213. The bottom and side surfaces of each plug 228 are covered and contacted with a corresponding barrier metal 226. Thus, the plugs 228 and the barrier metals 226 are buried in the layers 211, 212, and 213. The plugs 228 are made of copper or copper-based alloy. The barrier metal 226 of each plug 228 is contacted with the top of a corresponding one of the underlying first wiring lines 210.

The barrier metal 226 is provided to prevent the Cu atoms of the first plugs 228 from diffusing into the neighboring materials.

A second dielectric etch-stop layer 214 is formed to cover the tops of the plugs 228 and the exposed areas of the second hard-mask layer 213. On the second etch-stop layer 214, a third dielectric SiOCH layer 217 and a third dielectric hard-mask layer 218 are stacked in this order. The combination of the layers 217 and 218 serves as an interlayer dielectric layer.

A second wiring, which includes second wiring lines (or wires) 224 and corresponding barrier metals 221, is formed in such a way as to be buried in the stacked dielectric layers 214, 217, and 218. Thus, like the first wiring, the second wiring has a buried wiring structure. The wiring lines 224 are made of copper or copper-based alloy. Each barrier metal 221 covers and contacts the bottom and side surfaces of a corresponding one of the wiring lines 224. The barrier metal 221 of each line 224 is contacted with the top of a corresponding one of the first conductor plugs 228.

A second dielectric barrier layer 223 is formed to cover the top of the second wiring and the exposed areas of the third hard-mask layer 218.

As explained above, the semiconductor device of FIG. 2 has a two-layer wiring structure made of copper or copper-based alloy with the single damascene structure.

If necessary, the same wiring structure as shown in FIG. 2 is repeatedly stacked on the second dielectric barrier layer 223, thereby forming a multilevel wiring structure.

The first and second dielectric barrier layers 211 and 223, and the first and second dielectric etch-stop layers 202 and 214 are made of SiCH or SiCHN.

(Fabrication Method of the Device)

Next, a method of fabricating the semiconductor device of FIG. 2 is explained below with reference to FIGS. 3A to 3O. In this method, a single damascene process is used.

First, as shown in FIG. 3A, a dielectric layer 301 is formed on a single-crystal Si substrate 300 by a known method. e.g., a CVD method. The substrate 300 includes necessary circuit elements such as MOSFETs formed In its surface area. The dielectric layer 301 covers the whole surface of the substrate and serves as an interlayer dielectric layer.

On the dielectric layer 301, a first dielectric etch-stop layer 302, a first dielectric SiOCH layer 303, and a first dielectric hard-mask layer 304 are successively formed in this order.

Figure 4:
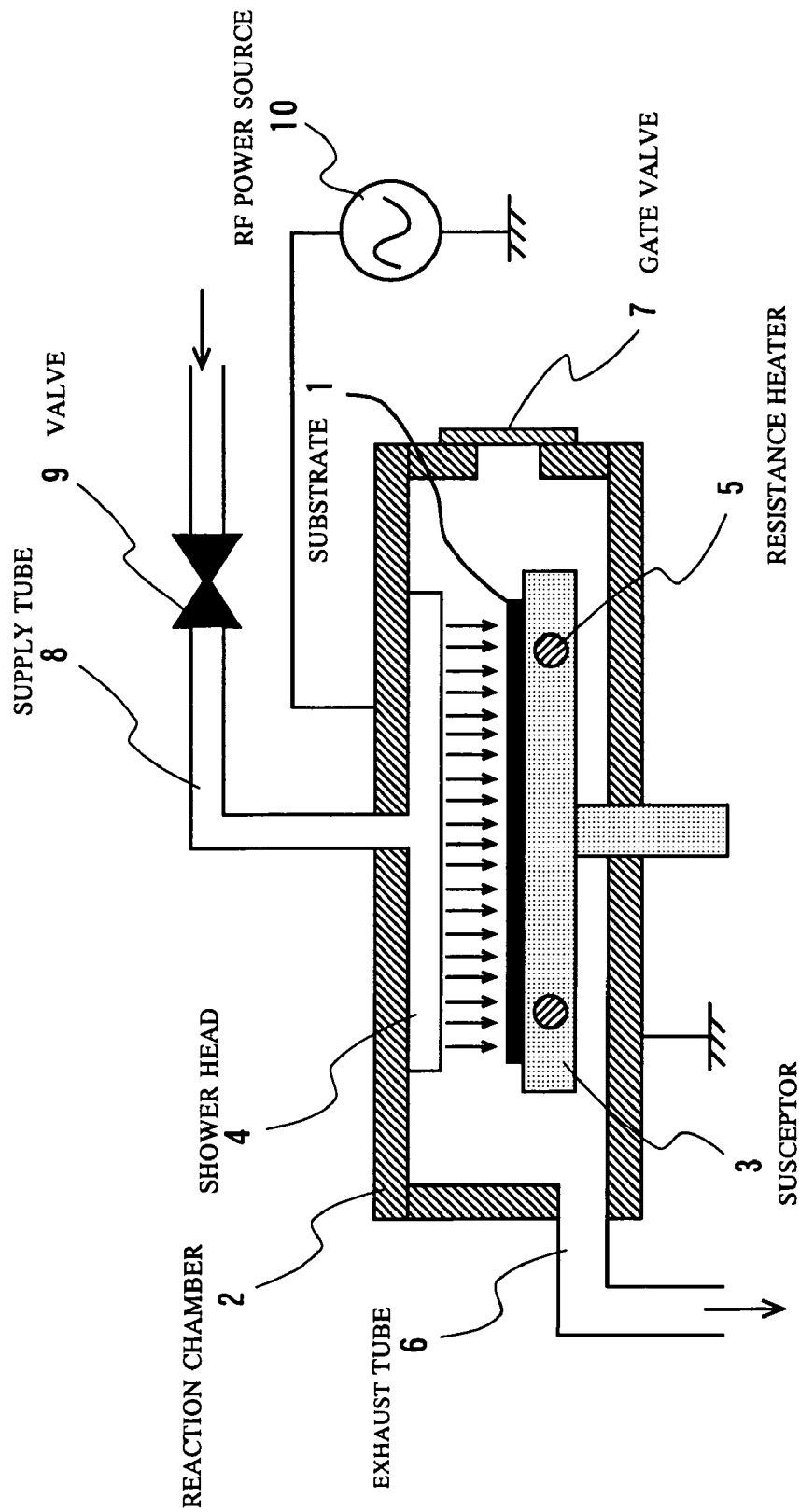
FIG. 4 is a schematic cross-sectional view showing the configuration of a parallel-plate PECVD apparatus.

The first dielectric etch-stop layer 302 is made of SiCH or SiCHN and has a thickness of 30 nm to 150 nm. The layer 302 is formed by a PECVD method using a known parallel-plate PECVD apparatus. An example of the parallel-plate PECVD apparatus is shown in FIG. 4, which will be explained later.

The first SiOCH layer 303 has a thickness of approximately 200 nm to 1000 nm The layer 303 is formed by a PECVD method using a known parallel-plate PECVD apparatus.

The first dielectric hard-mask layer 304 is made of $SiO_2$, SiN, or SiON and has a thickness of approximately 50 nm to 200 nm. The layer 304 is formed by a known method such as a PECVD method.

On the first hard-mask layer 304, an antireflection layer 325 is formed and then, a first photoresist film 305 is formed on the layer 325. Thereafter, the film 305 is patterned to have a pattern 306 for the first wiring lines using a known photolithography technique. The state at this stage is shown in FIG. 3A. The antireflection layer 325 is provided to prevent the irradiated exposure light from being reflected by the first hard-mask layer 304 in the photolithography process.

Using the patterned first photoresist film 305 as a mask, the antireflection layer 325, the first hard-mask layer 304, and the first SiOCH layer 303 are selectively removed by a known dry etching method. Thereafter, the photoresist film 305 and the remaining antireflection layer 325 are removed. Thus, trenches 307 for the first wiring are formed, as shown in FIG. 3B. Since the first etch-stop layer 302 is formed on the dielectric layer 301, the etching action is not applied to the layer 301 in the dry etching process.

Subsequently, the entire layered structure on the substrate 300 is etched back by a known method. This etch-back process is continued until the first etch-stop layer 302 is selectively removed according to the trenches 307 to thereby expose the underlying dielectric layer 301 and then, desired depressions are formed in the layer 301 according to the trenches 307.

Figure 3C:
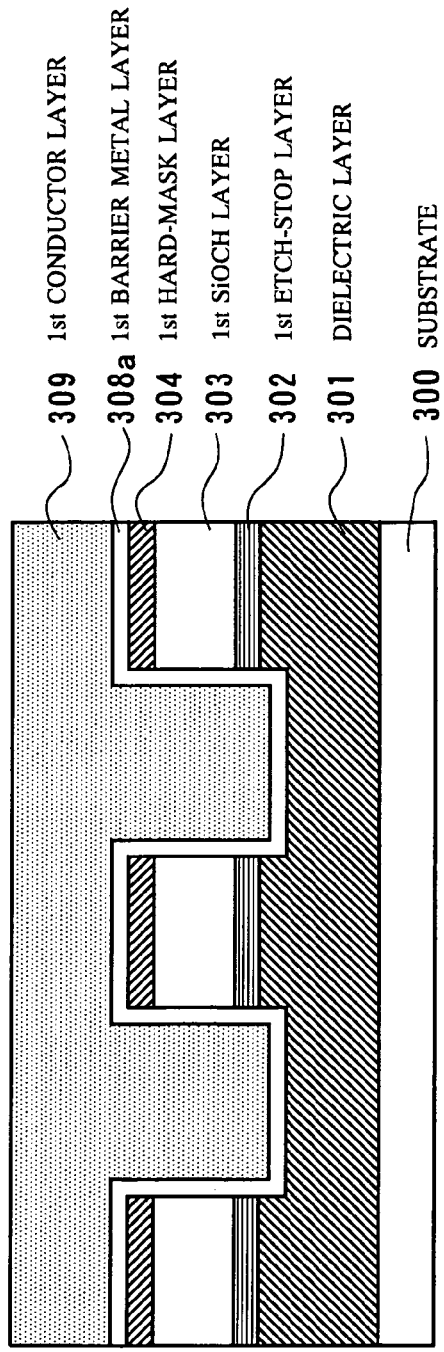
FIGS. 3A to 3O are partial cross-sectional views showing the process steps of the method of fabricating a semiconductor device according to the embodiment of the present invention, respectively, in which a single damascene process is used.

A first barrier metal layer 308a is formed to cover and contact the exposed surfaces of the remaining first hard-mask layer 304, the first SiOCH layer 303, the first etch-stop layer 302, and the dielectric layer 301, as shown in FIG. 3C. The layer 308 is thin and extends along the bottom and side surfaces of the respective trenches and the top surface of the layer 304. The first barrier metal layer 308a is made of Ta, TaN, TiN, or the like. The layer 308a is formed by a known sputtering or CVD method.

A first conductor layer 309 is formed on the first barrier metal layer 308a in such a way as to fill the respective trenches 307. Since the layer 309 is to form the main conductors of the first wiring lines, the layer 309 is thick and made of Cu or Cu-based alloy. The layer 309 is formed by a known sputtering, CVD, or plating method. The state at this stage is shown in FIG. 3C.

Figure 3D:
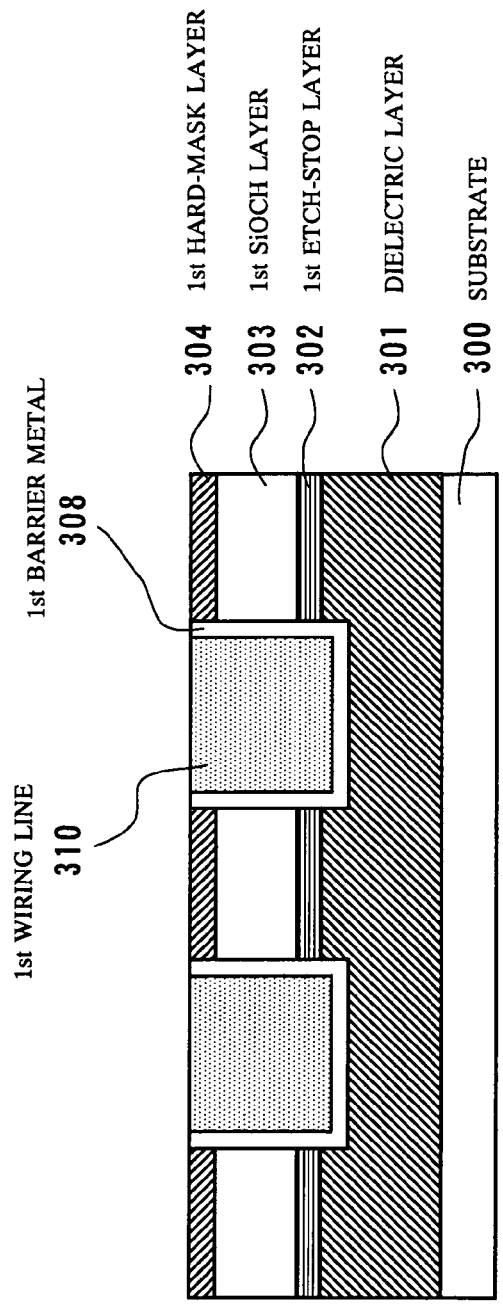

Thereafter, the first conductor layer 309 and the first barrier metal layer 308a are subject to a Chemical-Mechanical Polishing (CMP) process. This CMP process is carried out until the remaining first hard-mask layer 304 is exposed. Thus, the unnecessary part of the first conductor layer 309 and the unnecessary part of the first barrier metal layer 308a, both of which are located above the first hard-mask layer 304, are selectively removed. In this way, the first Cu wiring lines 310 are formed in the respective trenches using a known single damascene process. The lines 310 are buried in the trenches 307 along with the remaining first barrier metal layer 308a. The bottom and side surfaces of each line 310 are covered and contacted with a corresponding one of the barrier metals 308. The state at this stage is shown in FIG. 3D.

Next, first conductor plugs 328 are formed in the following way by a method like a known damascene process.

Figure 3E:
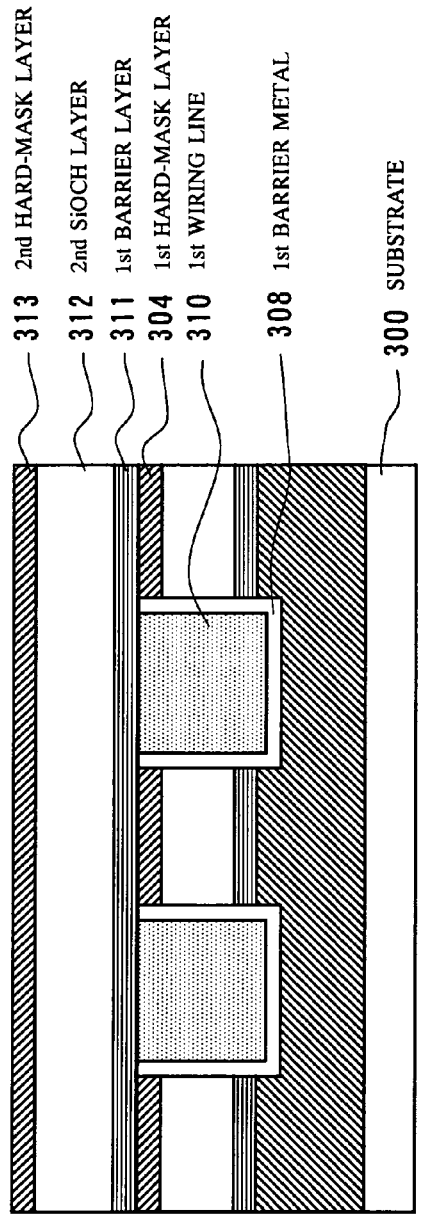

Specifically, as shown in FIG. 3E, a first dielectric barrier layer 311 is formed to cover the top of the first wiring and the exposed areas of the first hard-mask layer 304. On the first barrier layer 311, a second SiOCH layer 312 and a second dielectric hard-mask layer 313 are successively formed in this order. The combination of the layers 312 and 313 serves as an interlayer dielectric layer.

Figure 3F:
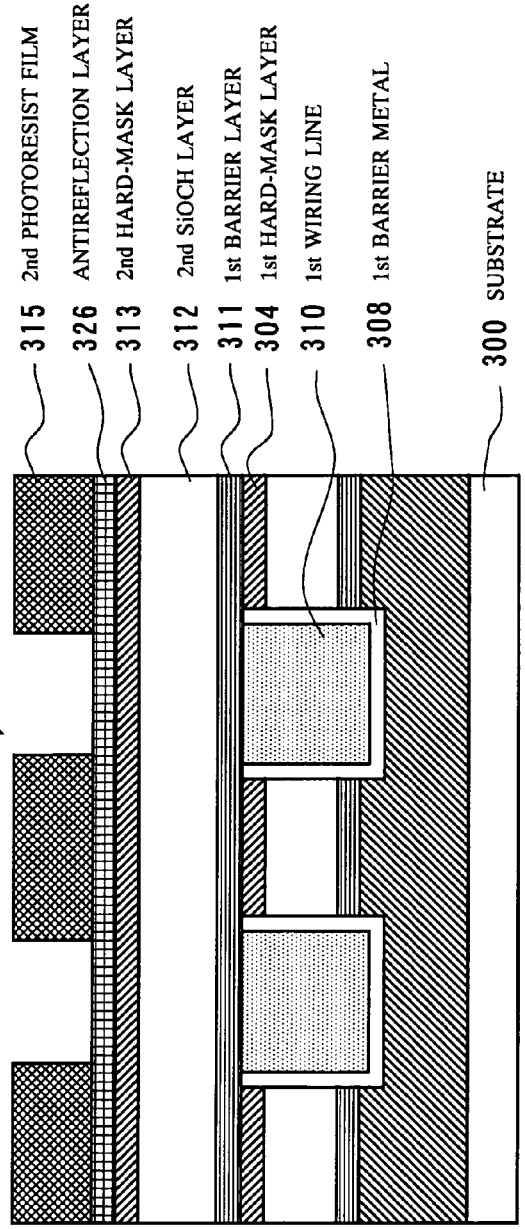

On the second dielectric hard-mask layer 313, an antireflectlon layer 326 is formed and then, a second photoresist film 315 is formed on the layer 326. Thereafter, the film 315 is patterned to have a pattern 316 for vias 331 using a known photolithography technique. The state at this stage is shown in FIG. 3F. The antireflection layer 326 is provided to prevent the irradiated exposure light from being reflected by the second hard-mask layer 313 in the photolithography process.

Figure 3G:
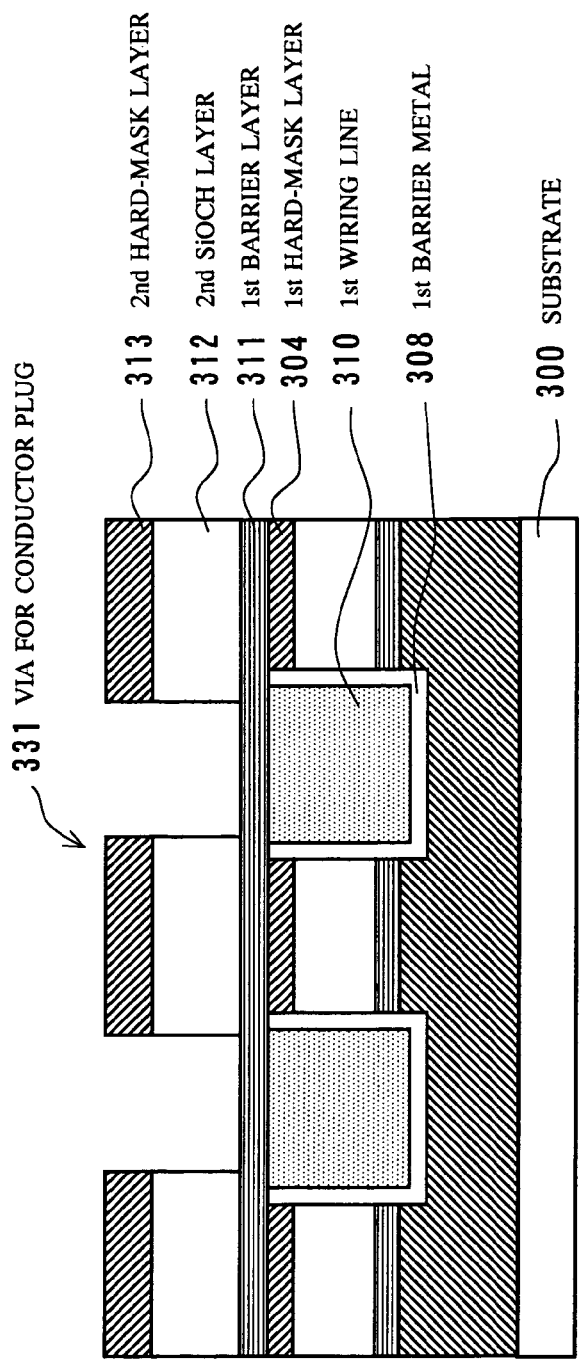

Using the patterned second photoresist film 315 as a mask, the antireflection layer 326, the second hard-mask layer 313, and the second SiOCH layer 312 are selectively removed by a known dry etching method. Thereafter, the photoresist film 315 and the remaining antireflection layer 326 are removed. Thus, vias 331 for the conductor plugs are formed, as shown in FIG. 3G. Since the first barrier layer 311 is formed below the second SiOCH layer 312, the etching action is not applied to the first wiring in the dry etching process.

Subsequently, the entire layered structure on the substrate 300 is etched back by a known method. This etch-back process is continued until the first barrier layer 311 is selectively removed according to the vias 331 to thereby expose the underlying first wiring lines 310. The state at this stage is shown in FIG. 3G.

A second barrier metal layer 326a is formed to cover and contact the exposed surfaces of the remaining second hard-mask layer 313, the second SiOCH layer 312, and the first barrier dielectric layer 311, as shown in FIG. 3H. The barrier metal layer 326a is thin and extends along the bottom and side surfaces of the respective vias 331 and the top surfaces of the wiring lines 310. The second barrier metal layer 326a is made of Ta, TaN, TiN, or the like. The layer 326a is formed by a known sputtering or CVD method.

A second conductor layer 327 is formed on the second barrier metal layer 326a in such a way as to fill the respective vias 331. Since the layer 327 is to form the main conductor of the second wiring, the layer 327 is thick and made of Cu or Cu-based alloy. The layer 327 is formed by a known sputtering, CVD, or plating method. The state at this stage is shown in FIG. 3H.

Thereafter, the second conductor layer 327 and the second barrier metal layer 326a are subject to a CMP process. This CMP process is carried out until the remaining second hard-mask layer 313 is exposed. The layer 326a is made of Ta, TaN, or TiN. Thus, the unnecessary part of the second conductor layer 327 and the unnecessary part of the second barrier metal layer 326a, both of which are located above the second hard-mask layer 313, are selectively removed. In this way, the first conductor plugs 328 are formed in the respective vias 331. The plugs 328 are buried in the vias 331 along with the remaining second barrier metal layer 326a (i.e., the second barrier metals 326). The bottom and side surfaces of each plug 328 are covered and contacted with a corresponding one of the second barrier metals 326. The state at this stage is shown in FIG. 3I.

A second dielectric etch-stop layer 314 is formed to cover the plugs 328, as shown in FIG. 3J. The second etch-stop layer 314 is made of SiCH or SiCHN and has a thickness of 30 nm to 150 nm. The layer 314 is formed by a PECVD method using a known parallel-plate PECVD apparatus.

Figure 3K:
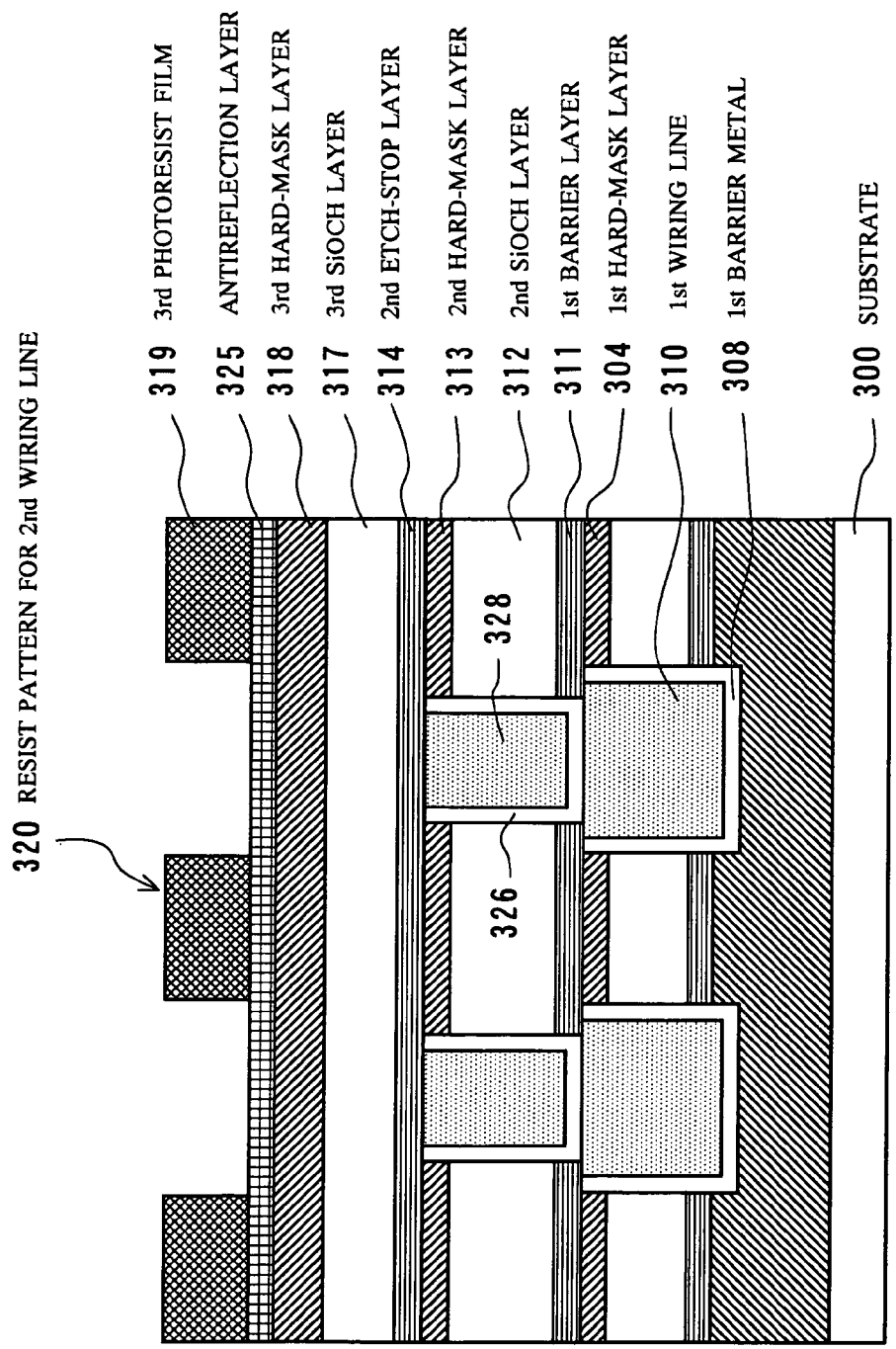

On the second etch-stop layer 314, as shown in FIG. 3K, a third SiOCH layer 317 and a third dielectric hard-mask layer 318 are successively formed in this order.

The third SiOCH layer 317 has a thickness of approximately 200 nm to 1000 nm. The layer 317 is formed by a PECVD method using a known parallel-plate PECVD apparatus.

The third dielectric hard-mask layer 318 is made of $SiO_2$, SiN, or SiON and has a thickness of approximately 50 nm to 200 nm. The layer 318 is formed by a known method such as a PECVD method.

On the third dielectric hard-mask layer 318, an antireflectlon layer 325 is formed and then, a third photoresist film 319 is formed on the layer 325. Thereafter, the film 319 is patterned to have a pattern 320 for the second wiring lines using a known photolithography technique. The state at this stage is shown in FIG. 3K. The antireflection layer 325 is provided to prevent the irradiated exposure light from being reflected by the third hard-mask layer 318 in the photolithography process.

Using the patterned third photoresist film 319 as a mask, the antireflection layer 325, the third hard-mask layer 318, and the third SiOCH layer 318 are selectively removed by a known dry etching method. Thereafter, the photoresist film 319 and the remaining antireflection layer 326 are removed. Thus, trenches 332 for the second wiring lines are formed, as shown in FIG. 3L. Since the second etch-stop layer 314 is formed to cover the plugs 328 and the remaining second hard-mask layer 313, the etching action is not applied to the plugs 328 and their neighborhoods in the dry etching process.

Subsequently, the entire layered structure on the substrate 300 is etched back by a known method. This etch-back process is continued until the second etch-stop layer 314 is selectively removed according to the trenches 332 to thereby expose the underlying plugs 328. The state at this stage is shown in FIG. 3L.

Figure 3M:
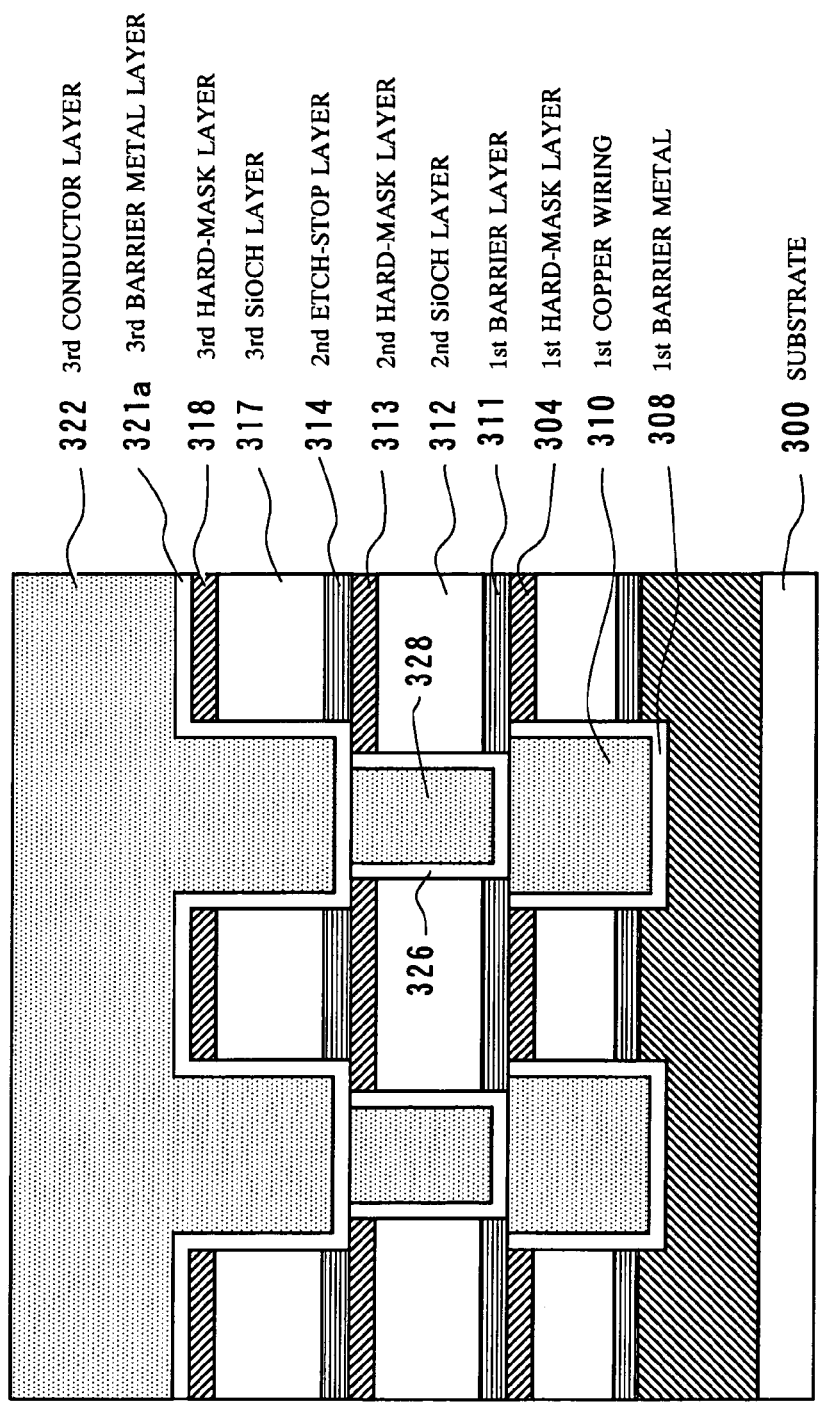

A third conductor layer 322 is formed on the third barrier metal layer 321a in such a way as to fill the respective trenches. Since the layer 322 is to form the main conductor of the second wiring, the layer 322 is thick and made of Cu or Cu-based alloy. The layer 322 is formed by a known sputtering, CVD, or plating method. The state at this stage is shown in FIG. 3M.

Figure 3N:
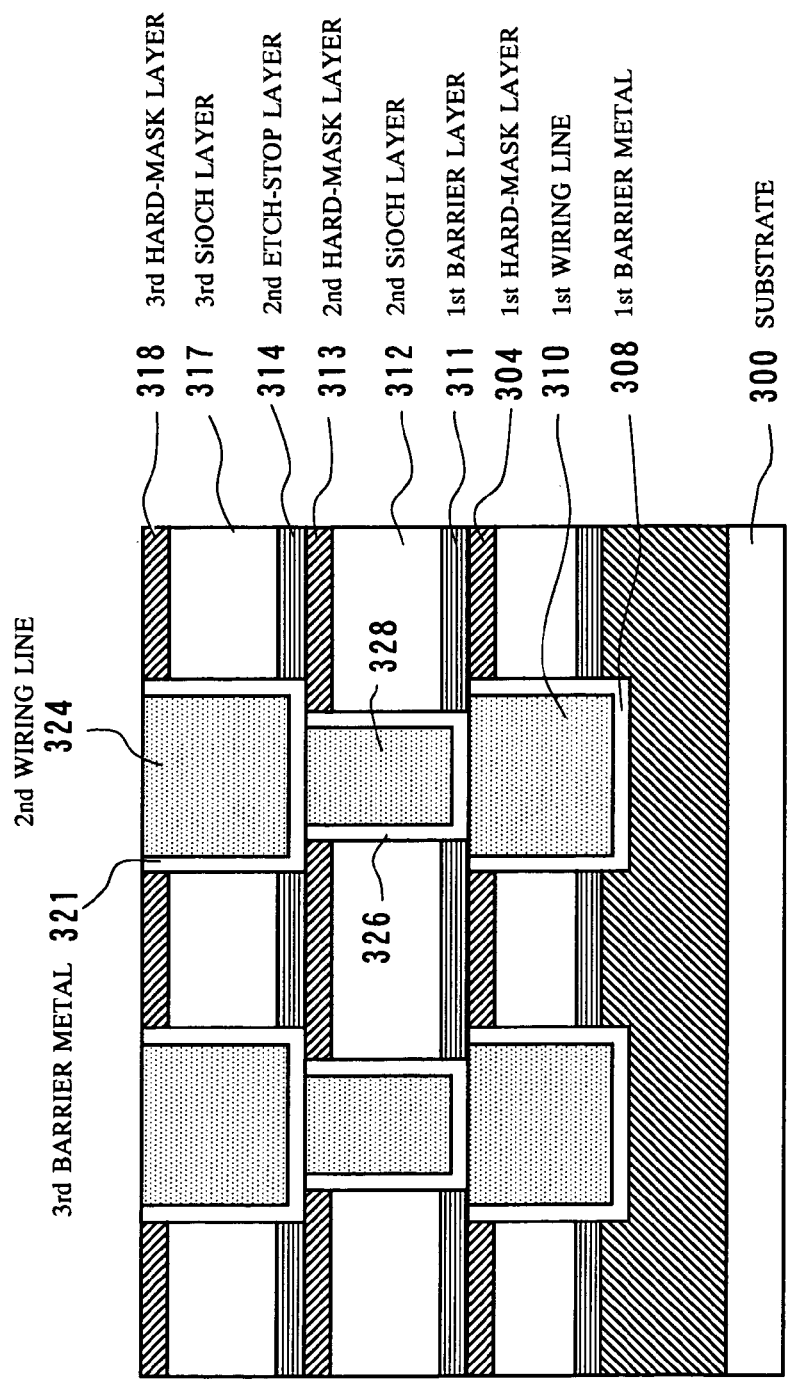
Figure 30:
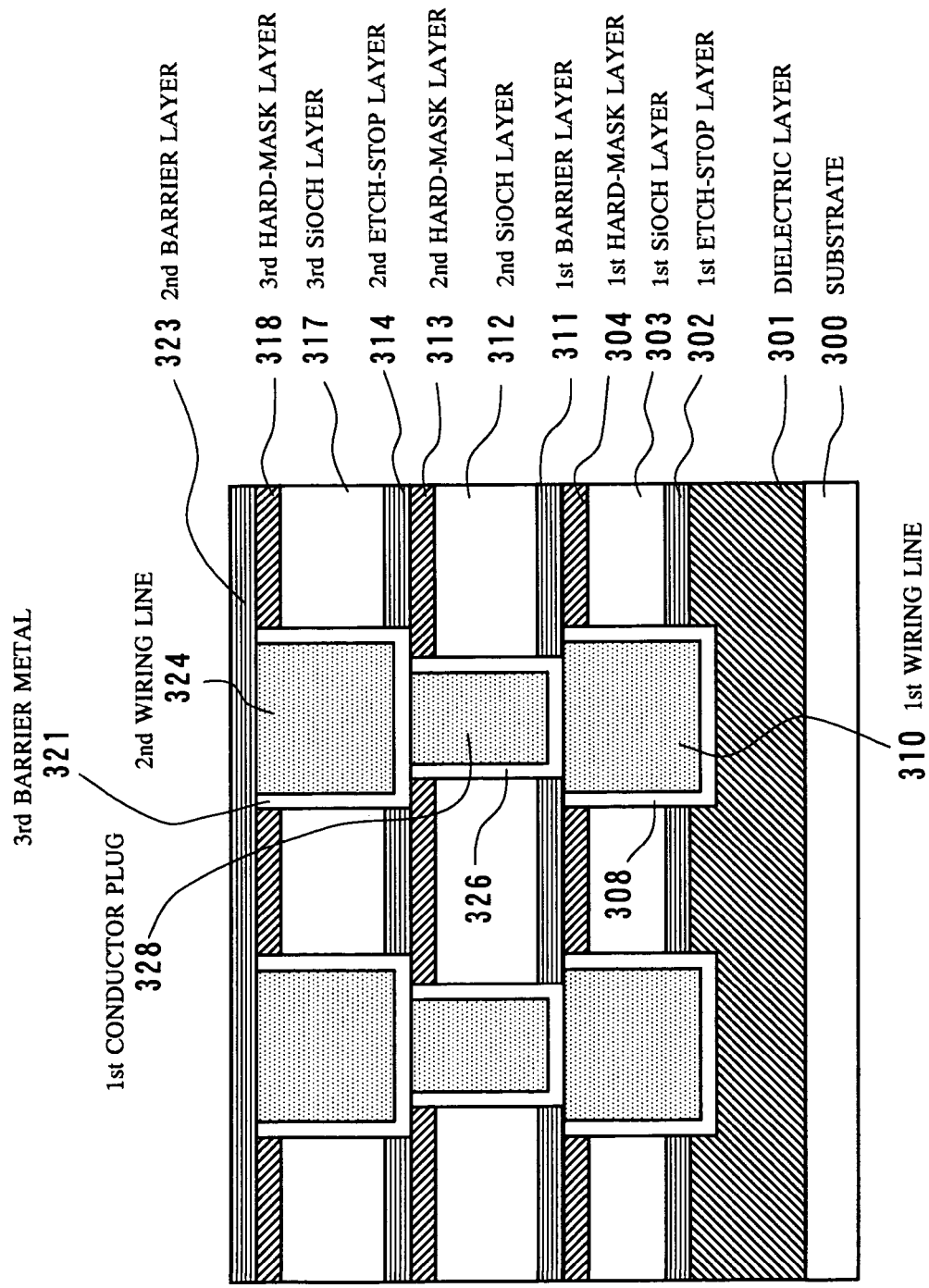

Thereafter, the third conductor layer 322 and the third barrier metal layer 321a are subject to a CMP process. This CMP process is carried out until the remaining third hard-mask layer 318 is exposed. Thus, the unnecessary part of the third conductor layer 322 and the unnecessary part of the third barrier metal layer 321a, both of which are located above the third hard-mask layer 318, are selectively removed. In this way, the second copper wiring lines 324 are formed in the respective trenches 332 using a known single damascene process. The lines 324 are burled in the trenches 332 along with the third barrier metals 321. The metals 321 cover and contact the bottom and side surfaces of the corresponding lines 324. The state at this stage is shown in FIG. 3N.

A second dielectric barrier layer 323 is formed to cover the top of the second wiring and the exposed areas of the third hard-mask layer 318. The state at this stage is shown In FIG. 3O.

Through the above-described process steps, the semiconductor device having a two-level wiring structure is fabricated, as shown in FIG. 3O. The device of FIG. 3O has the same configuration as that of the device of FIG. 2.

(Configuration of PECVD Apparatus)

FIG. 4 schematically shows a parallel-plate PECVD apparatus used in the above-described method of the embodiment.

The apparatus comprises a reaction chamber 2, a susceptor 3, a shower head 4, a resistance heater 5, an exhaust tube 6, a gate valve 7, a supply tube 8, a valve 9, and a Radio-Frequency (RF) power source 10.

The susceptor 3, which is located in the chamber 2, is used to hold a semiconductor substrate 1 to be processed. The resistance heater 5 is built in the susceptor 3. The heater 5 applies heat to the substrate 1 placed thereon, raising the temperature of the substrate 1 to a desired level. The shower head 4, which is located in the chamber 2, is fixed to be opposed to the susceptor 3 at a specific distance. The head 4 is parallel to the susceptor 3, forming a pair of parallel plates.

The gate valve 7 is provided for carrying the substrate 1 in the chamber 2 and for carrying out the substrate 1 from the chamber 2.

An end of the supply tube 8 is connected to the head 4. A required material or materials (i.e. a process gas or gasses) is/are fed into the chamber 2 by way of the tube 8 and the head 4 after its flow rate is controlled to a predetermined level with a mass flow controller (not shown). The material or materials is/are uniformly emitted from the lower surface of the head 4 toward the susceptor 3. The valve 9 is used to control the flow of the material or materials in the tube 8.

An end of the exhaust tube 6 is connected to the chamber 2 and the other end thereof is connected to a vacuum pump (not shown). The tube 6 is used to exhaust the gas or gasses existing in the chamber 2 to the outside. In other words, the tube 6 is used to evacuate the chamber 2.

The RF power source 10 supplies a predetermined RF power to the chamber 2. The susceptor 3 and the head 4 serve as a pair of parallel-plate electrodes. The RF power from the source 10 is fed to the intervening space between the susceptor 3 and the head 4, thereby inducing a desired plasma region in the chamber 2.

(Process of Forming SiCH Layer)

In the above-described method of fabricating the semiconductor device according to the embodiment of the invention, the step of forming the first or second etch-stop layer 302 or 314 made of SiCH or SiCHN and the step of forming the first, second, or third SiOCH layer 303, 312, or 317 are carried out using the parallel-plate PECVD apparatus shown in FIG. 4.

The first or second etch-stop layer 302 or 314 made of SiCH (i.e., the SiCH layer) is formed in the following way. This process includes the steps S1 to S7 shown in FIG. 1.

First, the semiconductor substrate 1 is carried in the reaction chamber 2 by way of the gate valve 7 and placed on the susceptor 3 (Step S1). The susceptor 3 is heated up to a predetermined temperature in the range from 150° C. to 450° C. The temperature of the substrate 1 is raised by the heat from the susceptor 3.

Next, He or $H_2$ gas is introduced into the chamber 2 by way of the supply tube 8 at a flow rate of 500 to 10000 SCCM and then, the pressure in the chamber 2 is adjusted to a level in the range of 1.0 to 10 Torr. The thus-adjusted pressure of the He or $H_2$ gas is kept for 5 to 100 seconds for stabilizing the temperature of the substrate 1 (Step S2). Thus, the temperature of the whole substrate 1 is made substantially uniform faster than the above-described prior art method due to relatively high thermal conductivity of the He or $H_2$ gas introduced.

The chamber 2 is then evacuated for 5 to 20 seconds, thereby removing the He or $H_2$ gas from the chamber 2 by way of the exhaust tube 6 (Stop S3).

Thereafter, an organic silane and an inert gas are fed into the chamber 2 by way of the supply tube 8 and the head 4 (Step S4). The organic silane is fed at a flow rate of 100 to 500 SCCM. The inert gas is fed at a flow rate of 500 to 2000 SCCM. Then, the pressure in the chamber 2 is adjusted to a level in the range of 2.0 to 10 Torr. The thus-adjusted pressure of the mixture of the organic silane and the inert gas is kept for 5 to 10 seconds.

Subsequently, RF power of 200 to 500 W is supplied to the chamber 2 by the power source 10, thereby inducing a plasma region in the intervening space between the susceptor and the head 4. Thus, a PHCVD process is carried out and a SiCH layer is deposited on the substrate 1 as the first or second etch-stop layer 302 or 314 using the organic silane as the gaseous material (Step S5). The Inert gas serves as a carrier gas.

Following this, the chamber 2 is evacuated to remove the gases existing in the chamber 2 to the outside (Step S6). Finally, the substrate 1 on which the SiCH layer 302 or 314 has been formed is carried out from the chamber 2 (Step S7).

As the organic silane, trimethylsilane [$(CH_3)_3Si$], tetramethylsilane [$(CH_3)_4Si$], or trimethylvinylsilane [$(CH_3)_3SiCH=CH_2$] is used.

As the inert gas, He, Ar, or Xe is used. A mixture of at least two of He, Ar, and Xe may be used.

When He gas is used for stabilizing the temperature of the substrate 1, the step S6 for evacuating the gas existing in the chamber 2 after the deposition of SiCH layer may be eliminated.

(Process of Forming SiCHN Layer)

The first or second etch-stop layer 302 or 314 made of SiCHN (i.e., the SiCHN layer) is formed in the following way. This process includes the steps S1 to S7 shown in FIG. 1 as well.

First, the semiconductor substrate 1 is carried in the reaction chamber 2 by way of the gate valve 7 and placed on the susceptor 3 (Step S1). The susceptor 3 is heated up to a predetermined temperature in the range from 150° C. to 450° C. The temperature of the substrate 1 is raised by the heat from the susceptor 3.

Next, He or $H_2$ gas is introduced into the chamber 2 by way of the supply tube 8 at a flow rate of 500 to 10000 SCCM and then, the pressure in the chamber 2 is adjusted to a level in the range of 1.0 to 10 Torr. The thus-adjusted pressure of the He or $H_2$ gas is kept for 5 to 100 seconds for stabilizing the temperature of the substrate 1 (Step S2). Thus, the temperature of the whole substrate 1 is made substantially uniform faster than the above-described prior art method due to relatively high thermal conductivity of the He or $H_2$ gas introduced.

The chamber 2 is then evacuated for 5 to 20 seconds, thereby removing the He or $H_2$ gas from the chamber 2 by way of the exhaust tube 6 (Step S3).

These process steps are the same as those of the SiCH layer described above.

Thereafter, an organic silane, an inert gas, and a nitrogen-containing gas are fed into the chamber 2 by way of the supply tube B and the head 4 (Step S4). The organic silane is fed at a flow rate of 100 to 500 SCCM. The inert gas is fed at a flow rate of 500 to 2000 SCCM. The nitrogen-containing gas is fed at a flow rate of 100 to 500 SCCM. Then, the pressure in the chamber 2 is adjusted to a level in the range of 2.0 to 10 Torr. The thus-adjusted pressure of the mixture of the organic silane, the inert gas, and the oxidizing gas is kept for 5 to 10 seconds.

Subsequently, RF power of 200 to 500 W is supplied to the chamber 2 by the power source 10, thereby inducing plasma region in the intervening space between the susceptor and the head 4. Thus, a PHCVD process is carried out and a SiCHN layer is deposited on the substrate 1 using the organic silane and the nitrogen-containing gas as the gaseous material (Step S5). The inert gas serves as a carrier gas.

Following this, the chamber 2 is evacuated to remove the gases existing in the chamber 2 to the outside (Step S6). Finally, the substrate 1 on which the SiCHN layer 302 or 314 has been formed is carried out from the chamber 2 (Step S7).

As the organic silane, trimethylsilane [$(CH_3)_3Si$], tetramethylsilane [$(CH_3)_4Si$], or trimethylvinylsilane [$(CH_3)_3SiCH=CH_2$] is preferably used. This is the same as the process of the SiCH layer.

As the inert gas, He, Ar, or Xe is preferably used. A mixture of at least two of He, Ar, and Xe may be used. This is the same as the process of the SiCH layer.

As the nitrogen-containing gas, ammonia ($NH_3$) is preferably used.

When He gas is used for stabilizing the temperature of the substrate 1, the step S6 may be eliminated. This is the same as the process of the SiCH layer.

(Process of Forming SiOCH Layer)

The first, second, or third SiOCH layer 303, 312, or 317 is formed in the following way.

First, the semiconductor substrate 1 is carried in the reaction chamber 2 by way of the gate valve 7 and placed on the susceptor 3 (Step S1). The susceptor 3 is heated up to a predetermined temperature in the range from 150° C. to 450° C. The temperature of the substrate 1 is raised by the heat from the susceptor 3.

Next, He or $H_2$ gas is introduced into the chamber 2 by way of the supply tube 8 at a flow rate of 500 to 10000 SCCM and then, the pressure in the chamber 2 is adjusted to a level in the range of 1.0 to 10 Torr. The thus-adjusted pressure of the He or $H_2$ gas is kept for 5 to 100 seconds for stabilizing the temperature of the substrate 1 (Step S2) Thus, the temperature of the whole substrate 1 is made substantially uniform faster than the above-described prior art method due to relatively high thermal conductivity of the He or $H_2$ gas introduced.

The chamber 2 is then evacuated for 5 to 20 seconds, thereby removing the He or $H_2$ gas from the chamber 2 by way of the exhaust tube 6 (Step S3).

These process steps are the same as those of the SiCH and SiCHN layers described above.

Thereafter, an organic silane, an inert gas, and an oxidizing gas are fed into the chamber 2 by way of the supply tube 8 and the head 4 (Step S4). The organic silane is fed at a flow rate of 500 to 2000 SCCM The inert gas is fed at a flow rate of 100 to 500 SCCM. The oxidizing gas is fed at a flow rate of 200 to 1000 SCCM. Then, the pressure in the chamber 2 is adjusted to a level In the range of 2.0 to 10 Torr. The thus-adjusted pressure of the mixture of the organic silane, the inert gas, and the oxidizing gas is kept for 5 to 10 seconds.

Subsequently, RF power of 200 to 1000 W is supplied to the chamber 2 by the power source 10, thereby inducing plasma region in the intervening space between the susceptor and the head 4. Thus, a PHCVD process is carried out and a SiOCH layer is deposited on the substrate 1 using the organic silane and the oxidizing gas as the gaseous material (Step S5). The inert gas serves as a carrier gas.

Following this, the chamber 2 is evacuated to remove the gases existing in the chamber 2 to the outside (Step S6). Finally, the substrate 1 on which the SiOCH layer 303, 312, or 317 has been formed is carried out from the chamber 2 (Step S7).

As the organic silane, trimethylsilane [$(CH_3)_3Si$], tetramethylsilane [$(CH_3)_4Si$], or trimethylvinylsilane [$(CH_3)_3SiCH=CH_2$] is preferably used. This is the same as the processes of the SiCH and SiCHN layers.

As the inert gas, He, Ar, or Xe is preferably used. A mixture of at least two of He, Ar, and Xe may be used. This is the same as the processes of the SiCH and SiCHN layers.

As the oxidizing gas, oxygen ($O_2$), ozone ($O_3$), carbon monoxide (CO), carbon dioxide ($CO_2$), or water ($H_2O$) is preferably used. A mixture of at least two of $O_2$, $O_3$, CO, $CO_2$, or $H_2O$ may be used.

When He gas is used for stabilizing the temperature of the substrate 1, the step S6 may be eliminated. This is the same as the processes of the SiCH and SiCHN layers.

With the method of fabricating a semiconductor device according to the embodiment of the invention, as a gas having a thermal conductivity of 0.1 W/mK or greater, He or $H_2$ gas is introduced into the chamber 2, thereby contacting the He or $H_2$ gas with the substrate 1 for stabilization of a temperature of the substrate 1. Thereafter, a desired dielectric layer (i.e., a SiCH, SiCHN, or SiOCH layer) is deposited on or over the substrate 1 in the reaction chamber 2 using a PECVD method. Thus, compared with the above-described prior-art method using $N_2$ gas having a thermal conductivity of 0.0260 W/mK for stabilizing the substrate temperature, the rise of the substrate temperature Is faster.

Therefore, without lengthening the period of contacting the He or $H_2$ gas with the substrate 1, the step of depositing the desired dielectric layer (I.e., the SiCH, SiCHN, or SiOCH layer) may start after the substrate temperature rises to a desired level. As a result, the quality of the deposited dielectric layer (i.e., the SiCH, SiCHN, or SiOCH layer) is improved in the initial stage of the step S5 of depositing the dielectric layer (i.e., the SiCH, SiCHN, or SiOCH layer). This improves the adhesion strength of the deposited dielectric layer (i.e., the SiCH, SiCHN, or SiOCH layer) to an underlying layer or the substrate 1.

Moreover, since $N_2$ gas is not used to stabilize the substrate temperature, there is no anxiety that the inter-wire TDDB life deterioration occurs due to the remaining $N_2$ gas. Thus, the reliability of the deposited dielectric layer (i.e., the SiCH, SiCHN, or SiOCH layer) is improved.

(Tests)

To confirm the advantages of the invention, the inventors performed the following tests.

First, to confirm the adhesion strength of the deposited dielectric layer, SiCH and SiCHN layers were respectively formed according to the above-described processes of forming SiCH and SiCHN layers of the method of the embodiment. At the same time, SiCH and SiCHN layers were respectively formed according to the above-described prior-art method. The step S2 for stabilizing the substrate temperature was carried out under the condition shown in Table 2 below. The other conditions in these methods were set the same.

TABLE 2

| CONDITION | PRIOR ART | INVENTION |
|---|---|---|
| GAS | $N_2$ | He |
| FLOW RATE (SCCM) | 2500 | 2500 |
| PRESSURE (Torr) | 5 | 5 |
| TEMPERATURE (° C.) | 350 | 350 |
| PERIOD (sec) | 60 | 60 |

Figure 5:
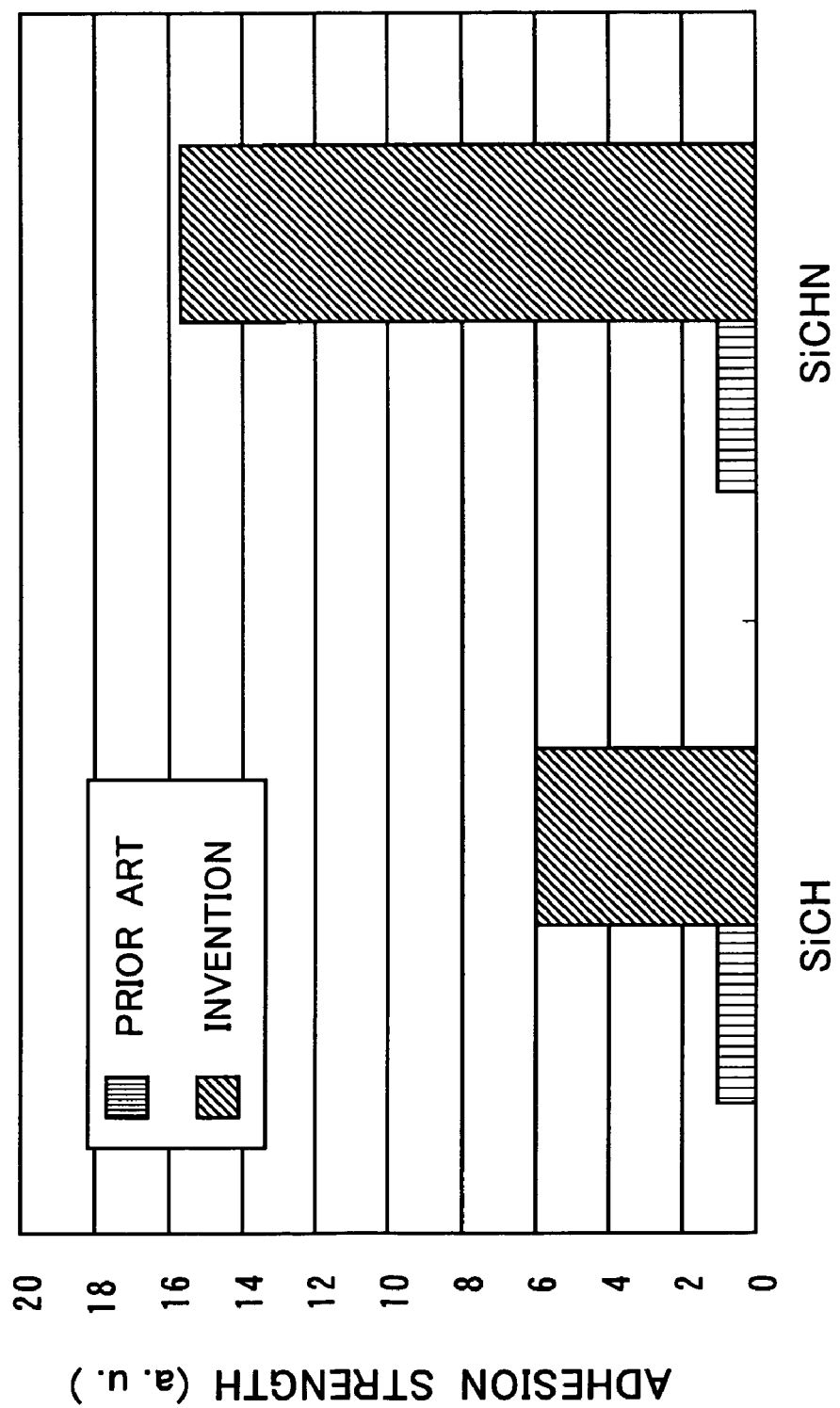
FIG. 5 is a graph showing the adhesion strength of the SiCH and SiCHN layers formed by the method according to the embodiment of the invention and the prior-art method.

FIG. 5 shows the result obtained by measuring the adhesion strength between the SiCH or SiCHN layer (i.e., the dielectric barrier layer 311 or 323) and the Cu layer (i.e., the Cu wiring lines 310 or 328 or 324) formed by the method of the invention and the prior-art method. The adhesion strength was measured by the known scratch test. As seen from FIG. 5, the adhesion strength of the SiCH and SiCHN layers formed by the method of the invention was improved compared with the SiCH and SiCHN layers formed by the prior-art method.

With the SiCH and SiCHN layers formed by the prior-art method, the deposition step S5 of the SiCH or SiCHN layer starts before the substrate temperature rises to a sufficiently high degree. Therefore, the quality of the SiCH or SiCHN layer was low or bad due to an excessive carbon amount in the initial stage of the deposition step S5, thereby causing the adhesion strength degradation of the SiCH or SiCHN layer to the underlying Cu layer.

Figure 6:
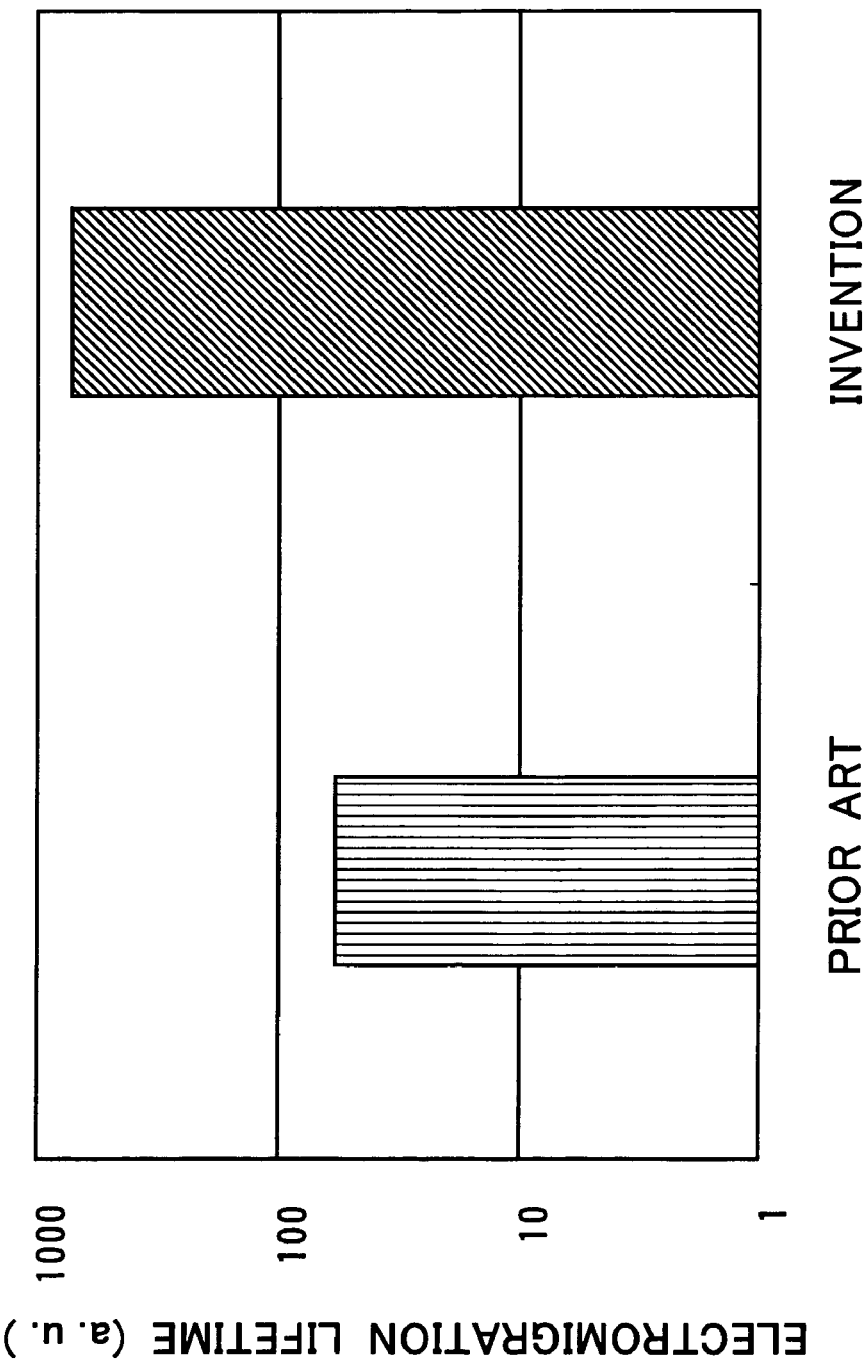
FIG. 6 is a graph showing the electromigration lifetime of the SiCHN layers formed by the method according to the embodiment of the invention and the prior-art method.

FIG. 6 shows the result obtained by measuring the electromigration resistance of the SiCHN layer (i.e., the barrier dielectric layer) formed by the method of the invention and the prior-art method. As seen from FIG. 6, the electromigration life of the SiCHN layer formed by the method of the invention was improved compared with the SiCHN layer formed by the prior-art method. The inventors thought that the reason of this improvement was created by the improvement of the adhesion strength.

Figure 7:
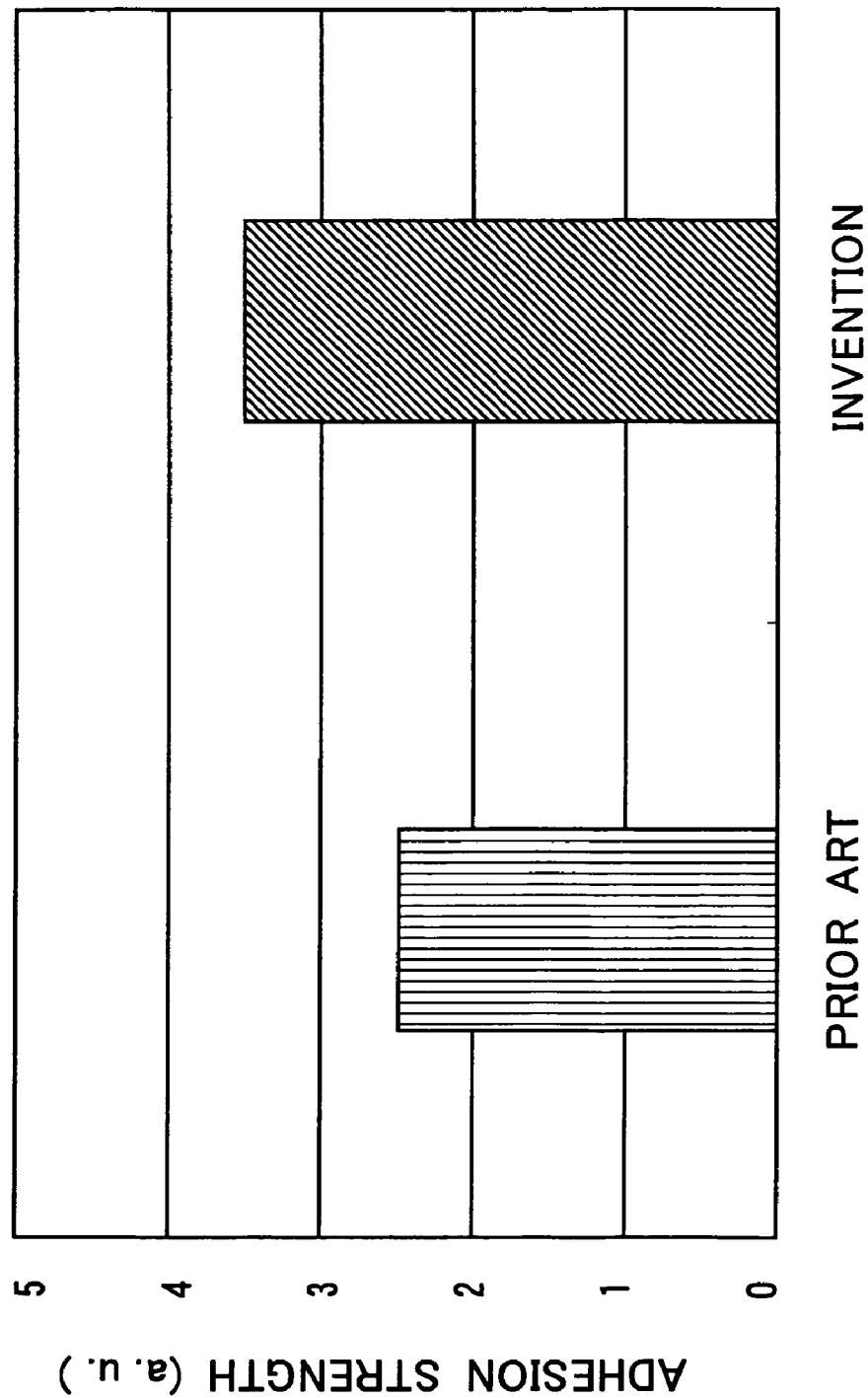
FIG. 7 is a graph showing the adhesion strength of the SiCHN layers formed by the method according to the embodiment of the invention and the prior-art method.

FIG. 7 shows the result obtained by measuring th adhesion strength between the SiOCH layer (i.e., part of the interlayer dielectric layer) and the SiCHN layer (i.e., the barrier dielectric layer) formed by the method of the invention and the prior-art method. The adhesion strength was measured by the known four-point bending method. As seen from FIG. 7, the adhesion strength between the SiOCH and SiCHN layers formed by the method of the invention was improved compared with the SiCH and SiCHN layers formed by the prior-art method. The inventors thought that the reason of this improvement was created by the same reason as the improvement (see FIG. 5) of the adhesion strength between the SiCH or SiCHN layer and the Cu layer.

Figure 8:
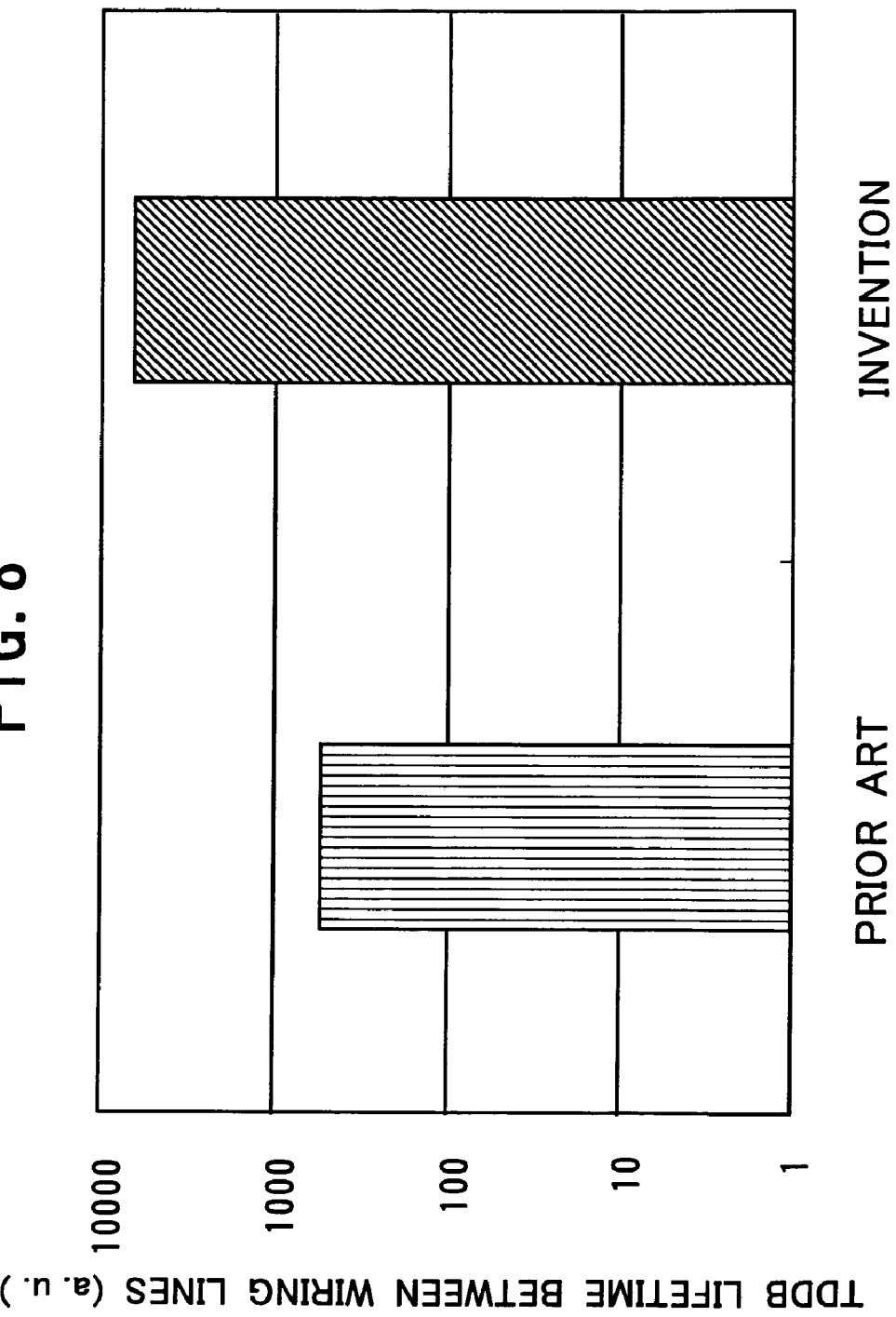
FIG. 8 is a graph showing the TDDB lifetime between wiring lines of the SiCHN layer formed by the method according to the embodiment of the invention and the prior-art method.

FIG. 8 shows the result obtained by measuring the TDDB life between the Cu wiring lines formed by the method of the invention and the prior-art method, where the SiCHN layer was used as the barrier dielectric layer. As seen from FIG. 8, the inter-wire TDDB life of the SiCHN layer formed by the method of the invention was approximately 10 times as long as that of the SiCHN layer formed by the prior-art method. This is prominent improvement.

Moreover, regarding the prior-art method where $N_2$ gas was used in the step S2, the inventors found that the inter-wire TDDB life of the SiCHN layer was deteriorated to approximately 1/10 when the period of the step S3 for evacuating the $N_2$ gas from the chamber 2 was shortened to 5 seconds from 10 seconds. Therefore, the inventors thought that the improvement of the inter-wire TDDB life of the SiCHN layer was created by prevention of the $N_2$ gas from entering the deposition gas used in the step S5.

Other Embodiments

It is needless to say that the present invention is not limited to the above-described embodiment. Any modification Is applicable to these embodiments. For example, although He or $H_2$ gas is used in the step S2 for substrate temperature stabilization in the embodiment, the invention is not limited to this. Any other gas may be used for this purpose if it has a thermal conductivity of 0.1 W/mK or greater.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device, comprising the steps of:
    placing a substrate in a chamber;
    introducing a gas having a thermal conductivity of 0.1 W/mK or greater into the chamber, thereby contacting the gas with the substrate for stabilization of a temperature of the substrate; and
    depositing a desired dielectric layer on or over the substrate in the chamber using a PECVD method after the step of introducing the gas
    wherein said gas having a thermal conductivity of 0.1 W/mK or greater comprises hydrogen ($H_2$) or helium (He) gas.

2. The method according to claim 1, wherein a dielectric layer made of one selected from the group consisting of SiCH, SiCHN, and SiOCH is used as the desired dielectric layer.

3. The method according to claim 1, wherein a SiCH layer is used as the desired dielectric layer; and the SiCH layer is deposited on or over the substrate using an organic silane and an inert gas.

4. The method according to claim 1, wherein a SiCHN layer is used as the desired dielectric layer;
    and the SiCHN layer is deposited on or over the substrate using an organic silane, an inert gas, and a nitrogen-containing gas.

5. The method according to claim 1, wherein a SiOCH layer is used as the desired dielectric layer;
    and the SiOCH layer is deposited on or over the substrate using an organic silane, an inert gas, and an oxidizing gas.

6. The method according to claim 3, wherein at least one selected from the group consisting of trimethylsilane [$(CH_3)_3Si$], tetramethylsilane [$(CH_3)_4Si$], and trimethylvinylsilane [$(CH_3)_3SiCH=CH_2$] is used as the organic silane.

7. The method according to claim 4, wherein at least one selected from the group consisting of trimethylsilane [$(CH_3)_3Si$], tetramethylsilane [$(CH_3)_4Si$], and trimethylvinylsilane [$(CH_3)_3SiCH=CH_2$] is used as the organic silane.

8. The method according to claim 5, wherein at least one selected from the group consisting of trimethylsilane [$(CH_3)_3Si$], tetramethylsilane [$(CH_3)_4Si$], and trimethylvinylsilane [$(CH_3)_3SiCH=CH_2$] is used as the organic silane.

9. The method according to claim 3, wherein at least one selected from the group consisting of helium (He), argon (Ar), and xenon (Xe) is used as the inert gas.

10. The method according to claim 4, wherein at least one selected from the group consisting of helium (He), argon (Ar), and xenon (Xe) is used as the inert gas.

11. The method according to claim 5, wherein at least one selected from the group consisting of helium (He), argon (Ar), and xenon (Xe) is used as the inert gas.

12. The method according to claim 4, wherein ammonia ($NH_3$) is used as the nitrogen-containing gas.

13. The method according to claim 5, wherein at least one selected from the group consisting of oxygen ($O_2$), ozone ($O_3$), carbon monoxide (CO), carbon dioxide ($CO_2$), and water ($H_2O$) is used as the oxidizing gas.

14. A method of fabricating a semiconductor device, comprising the steps of: placing a substrate in a chamber;
introducing hydrogen (H2) or helium (He) gas into the chamber, thereby contacting the gas with the substrate for stabilization of a temperature of the substrate;
introducing an organic silane and an inert gas into the chamber after evacuating the hydrogen (H2) or helium (He) gas; and
depositing a SiCH layer on or over the substrate using the organic silane and the inert gas while plasma is present in the chamber.

15. The method according to claim 14, wherein the SiCH layer is deposited on a copper wiring.

16. The method according to claim 14, wherein at least one selected from the group consisting of trimethylsilane [$(CH_3)_3Si$], tetramethylsilane [$(CH_2)_4Si$], and trimethylvinylsilane [$(CH_2)_3SiCH=CH_2$] is used as the organic silane.

17. The method according to claim 14, wherein at least one selected from the group consisting of helium (He), argon (Ar), and xenon (Xe) is used as the inert gas.

18. A method of fabricating a semiconductor device, comprising the steps of:
placing a substrate in a chamber;
introducing hydrogen ($H_2$) or helium (He) gas into the chamber, thereby contacting the gas with the substrate for stabilization of a temperature of the substrate;
introducing an organic silane, an inert gas, and a nitrogen-containing gas into the chamber after evacuating the hydrogen ($H_2$) or helium (He) gas; and
depositing a SiCHN layer on or over the substrate using the organic silane, the inert gas, and the nitrogen-containing gas while plasma is present in the chamber.

19. The method according to claim 18, wherein the SiCHN layer is deposited on a copper wiring.

20. The method according to claim 18, wherein at least one selected from the group consisting of trimethylsilane [$(CH_3)_3Si$], tetramethylsilane [$(CH_3)_4Si$], and trimethylvinylsilane [$(CH_3)_3SiCH=CH_2$] is used as the organic silane.

21. The method according to claim 18, wherein at least one selected from the group consisting of helium (He), argon (Ar), and xenon (Xe) is used as the inert gas.

22. The method according to claim 18, wherein ammonia ($NH_3$) is used as the nitrogen-containing gas.

23. A method of fabricating a semiconductor device, comprising the steps of:
placing a substrate in a chamber;
introducing hydrogen ($H_2$) or helium (He) gas into the chamber, thereby contacting the gas with the substrate for stabilization of a temperature of the substrate;
introducing an organic silane, an inert gas, and an oxidizing gas into the chamber after evacuating the hydrogen ($H_2$) or helium (He) gas; and
depositing a SiOCH layer on or over the substrate using the organic silane, the inert gas, and the oxidizing gas while plasma is present in the chamber.

24. The method according to claim 23, wherein the SiOCH layer is deposited on a SiCHN layer.

25. The method according to claim 23, wherein at least one selected from the group consisting of trimethylsilane [$(CH_3)_3Si$], tetramethylsilane [$(CH_3)_4Si$], and trimethylvinylsilane [$(CH_3)_3SiCH=CH_2$] is used as the organic silane.

26. The method according to claim 23, wherein at least one selected from the group consisting of helium (He), argon (Ar), and xenon (Xe) is used as the inert gas.

27. The method according to claim 23, wherein at least one selected from the group consisting of oxygen ($O_2$), ozone ($O_3$), carbon monoxide (CO), carbon dioxide ($CO_2$), and water ($H_2O$) is used as the oxidizing gas.

* * * * *